United States Patent
Tanaka

(10) Patent No.: US 8,433,974 B2
(45) Date of Patent: Apr. 30, 2013

(54) CYCLIC REDUNDANCY CHECK CODE GENERATING CIRCUIT AND CYCLIC REDUNDANCY CHECK CODE GENERATING METHOD

(75) Inventor: Masayuki Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 361 days.

(21) Appl. No.: 12/970,651

(22) Filed: Dec. 16, 2010

(65) Prior Publication Data

US 2011/0154159 A1    Jun. 23, 2011

(30) Foreign Application Priority Data

Dec. 21, 2009    (JP) .................................. 2009-288971

(51) Int. Cl.
*G06F 11/00* (2006.01)

(52) U.S. Cl.
USPC ........................................................ 714/758

(58) Field of Classification Search .................... 714/758
See application file for complete search history.

(56) References Cited

U.S. PATENT DOCUMENTS

| 7,249,306 | B2 * | 7/2007 | Chen .............................. 714/758 |
| 2003/0159101 | A1 * | 8/2003 | Hyland et al. ................. 714/781 |
| 2005/0005224 | A1 * | 1/2005 | Ridgeway et al. ............ 714/758 |
| 2005/0086571 | A1 * | 4/2005 | Farnsworth .................... 714/758 |
| 2008/0168323 | A1 * | 7/2008 | Clark et al. ..................... 714/758 |

FOREIGN PATENT DOCUMENTS

| JP | 8-149017 A | 6/1996 |
| JP | 8-330976 A | 12/1996 |
| JP | 9-64754 A | 3/1997 |

* cited by examiner

*Primary Examiner* — Marc Duncan
(74) *Attorney, Agent, or Firm* — Fujitsu Patent Center

(57) ABSTRACT

A cyclic redundancy check code generating circuit successively receives one or more parallel data as input, and repetitively performs a prescribed operation for calculating a cyclic redundancy check code for each parallel data, based on the parallel data and on an initial value or an earlier calculated cyclic redundancy check code. The cyclic redundancy check code generating circuit includes: a plurality of sub-operation units which, based on the initial value and the parallel data, perform sub-operations in different pipeline stages, respectively, by dividing the prescribed operation in a bit length direction of the parallel data; and a correction unit which, based on the initial value and the earlier calculated cyclic redundancy check code, corrects the cyclic redundancy check code calculated by the sub-operation units.

7 Claims, 25 Drawing Sheets

CYCLIC REDUNDANCY CHECK CODE GENERATING CIRCUIT AND CYCLIC REDUNDANCY CHECK CODE GENERATING METHOD

CROSS-REFERENCE TO RELATED APPLICATIONS

This application is based upon and claims the benefit of priority of the prior Japanese Patent Application No. 2009-288971, filed on Dec. 21, 2009, the entire contents of which are incorporated herein by reference.

FIELD

The embodiments discussed herein are related to a cyclic redundancy check code generating circuit and a cyclic redundancy check code generating method.

BACKGROUND

A variety of methods for generating cyclic redundancy check (CRC) codes are proposed in the prior art. For example, there is proposed a CRC code calculation method in which the calculation of a CRC on parallel input data is performed by re-expanding the parallel input data and by performing the sub-operations of divisions using the technique of pipeline processing. This method is intended to speed up the calculation process by preventing the number of circuit stages in an exclusive-OR circuit network from increasing in connection with the parallel expansion.

In the above method, data input from an input terminal is expanded by an expansion circuit into two parts on a word-by-word basis, and the CRC code for the input data is calculated using two first sub-operation circuits and one second sub-operation circuit. When generating the CRC code, the CRC code is appended to the final data word by a selector circuit, and the data and the CRC code are output from an even-numbered word output terminal and an odd-numbered word output terminal. When checking the CRC code, the data is checked by a check circuit for data errors after all the data has been input and, if any error is detected, the check circuit outputs a "high" signal at its output terminal.

There is also proposed a CRC code generating method that generates a CRC code using minimum information by constructing a logic circuit based on a given number of precalculated CRC codes but without using a division circuit or a ROM. The method includes the step of precalculating a number, n, of partial CRC codes corresponding to the respective bits of an n-bit operation bit sequence and the step of obtaining a CRC code for the entire n-bit operation bit sequence by using the values of the partial CRC codes, based on the effective value of each bit in the n-bit operation bit sequence. In the step of obtaining the CRC code, the CRC code for the entire n-bit operation bit sequence is obtained by decoding the effective value of each bit of the n-bit operation bit sequence into a partial CRC code by taking an exclusive-OR sum.

There is also proposed an error-detecting code generating circuit that can perform processing by using the number of parallel processes that exceeds the degree of the generating polynomial. In this method, a data sequence is divided into n sub-data sequences, 1, 2, ..., n, the respective sub-data sequences are processed independently of each other, and after data processing of all the sub-data sequences is completed, the exclusive-OR of the processing results are calculated. In each process, an operation that matches the number, n, of divisions is performed on the sub-data sequence preceding the last data of the input sub-data sequence, and an operation that matches the sub-data sequence, 1, 2, ..., n, is performed on the last data that is input to each processing means.

Related art is disclosed in Japanese Laid-open Patent Publications No. 8-330976, No. 8-149017 and No. 9-64754.

SUMMARY

According to one mode of the present invention, there is provided a cyclic redundancy check code generating circuit which successively receives one or more parallel data as input, and which generates a cyclic redundancy check code for the one or more parallel data by repetitively performing a operation for calculating a cyclic redundancy check code for each of the parallel data, based on the parallel data and on an initial value or an earlier calculated cyclic redundancy check code.

The cyclic redundancy check code generating circuit includes: a plurality of sub-operation units which, based on the initial value and the parallel data, perform sub-operations created by decomposing the operation in a bit length direction of the parallel data, in different pipeline stages, respectively; and a correction unit which, based on the initial value and the earlier calculated cyclic redundancy check code, corrects the cyclic redundancy check code calculated by the sub-operation units.

According to another mode of the present invention, there is provided a cyclic redundancy check code generating method which successively receives one or more parallel data, and which generates a cyclic redundancy check code for the one or more parallel data by repetitively performing a operation for calculating a cyclic redundancy check code for each of the parallel data, based on the parallel data and on an initial value or an earlier calculated cyclic redundancy check code.

The cyclic redundancy check code generating method includes: based on the initial value and the parallel data, performing sub-operations created by decomposing the operation in a bit length direction of the parallel data, in different pipeline stages, respectively; and based on the initial value and the earlier calculated cyclic redundancy check code, correcting the cyclic redundancy check code calculated by the sub-operations.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWING(S)

DESCRIPTION OF EMBODIMENT(S)

Figure 1:
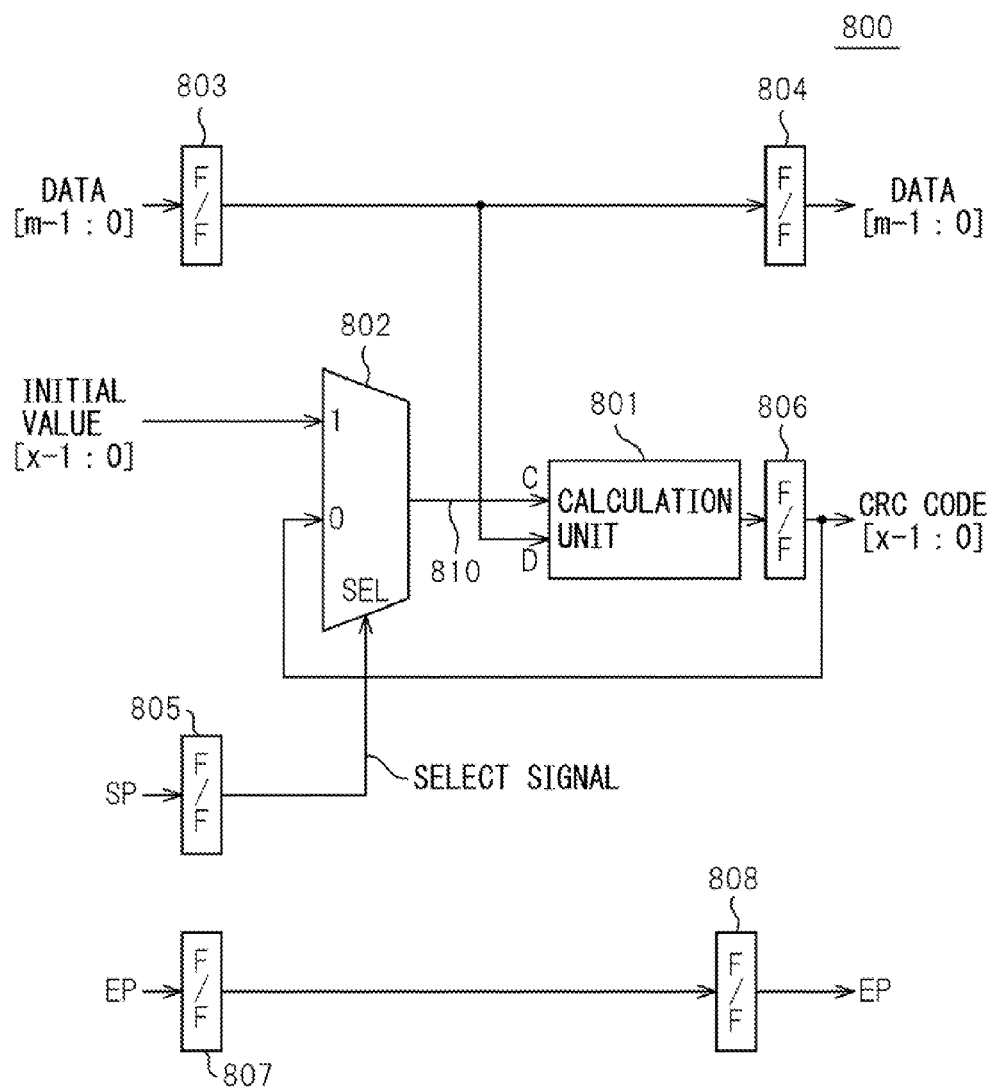
FIG. 1 is an explanatory diagram illustrating a CRC code calculation method for parallel data.

Preferred embodiments of the present invention will be explained with reference to the accompanying drawings. First, a CRC code calculation method for parallel data will be described. FIG. 1 is an explanatory diagram illustrating the CRC code calculation method for parallel data. A CRC code generating circuit 800 includes an calculation unit 801, a selector 802, and flip-flops 803 to 808.

The flip-flops 803 to 808 are each a state logic element that latches a new input signal from its preceding element by a clock edge and continues to output the same state to the next element until the next clock edge arrives. The same statement applies to the flip-flops used in other embodiments described herein.

The calculation unit 801 calculates an x-bit CRC code for a sequence of m-bit parallel data successively output from the flip-flop 803. The calculation unit 801 takes the sequence of m-bit parallel data successively output from the flip-flop 803, as input D, and the CRC code output from the selector 802, as input C. The calculation unit 801 performs a prescribed logic operation between the input C and the input D, to calculate the x-bit CRC code. The calculation unit 801 supplies the thus calculated CRC code to the flip-flop 806.

As an example, logic expressions for calculating the CRC code are given below for the case where the number of bits in the parallel data is 4 (m=4) and the generating polynomial is "$1+X^2+X^5$".

$CRC(0)=d(3)$ xor $d(0)$ xor $c(1)$ xor $c(4)$
$CRC(1)=d(1)$ xor $c(2)$
$CRC(2)=d(3)$ xor $d(2)$ xor $d(0)$ xor $c(1)$ xor $c(3)$ xor $c(4)$
$CRC(3)=d(3)$ xor $d(1)$ xor $c(2)$ xor $c(4)$
$CRC(4)=d(2)$ xor $c(0)$ xor $c(3)$ In the above expressions, CRC(0) to CRC(4) indicate the values of the first to fifth low-order bits of the CRC code obtained as the calculation result. On the other hand, d(0) to d(3) indicate the values of the first to fourth low-order bits of the input D. Similarly, c(0) to c(4) indicate the values of the first to fifth low-order bits of the input C.

The selector 802 supplies either the initial value or the output of the flip-flop 806 as the input C to the calculation unit 801 in accordance with the value of a start pulse SP that indicates the input timing of the starting data in the sequence of parallel data. The output of the flip-flop 806 represents the result of the calculation performed by the calculation unit 801 in the preceding clock cycle, i.e., the CRC code calculated for the sequence of parallel data that has been input up to the clock cycle preceding the current clock cycle.

The notation of the symbol associated with the selector 802 will be described. A select signal is applied via an input line "SEL". When the value of the select signal is "1" (or when the select signal is asserted), the value received via an input line "1" is selected for output 810. When the value of the select signal is "0" (or when the select signal is not asserted), the value received via an input line "0" is selected for output 810. The same notation is also used for the selector symbol used in other diagrams given herein.

In the illustrated example, when the value of the start pulse SP is "1" (which indicates the input timing of the starting data), the selector 802 selects for output the initial value which is the value applied on its input line "1". On the other hand, when the value of the start pulse SP is "0" (which indicates a period other than the input timing of the starting data), the selector 802 selects for output the value applied on its input line "0" which represents the output of the flip-flop 806.

Accordingly, in the clock cycle in which the starting data is input, the calculation unit 801 calculates the CRC code by performing a logic operation between the initial value and the starting data. In each subsequent clock cycle, the calculation unit 801 calculates the CRC code by performing a logic operation between the parallel data that is input in the current clock cycle and the CRC code calculated for the sequence of parallel data that has been input up to the preceding clock cycle.

The flip-flops 807 and 808 introduce a delay in an end pulse EP that indicates the timing for inserting the CRC code into the parallel data, and thereby synchronize the end pulse EP to the data and the CRC code.

Figure 2:
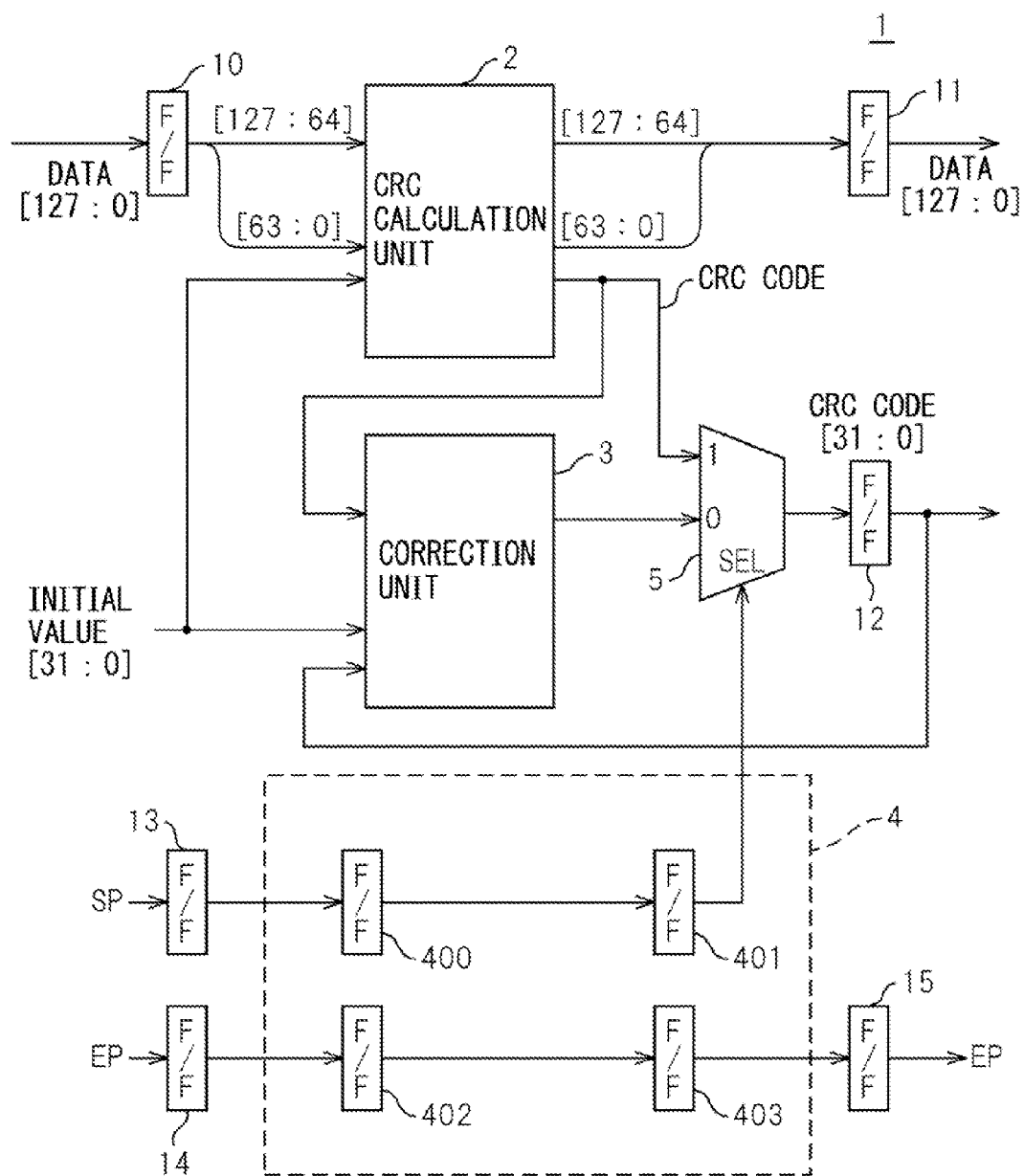
FIG. 2 is a diagram illustrating the configuration of a first embodiment of a CRC code generating circuit.

Next, embodiments of a CRC code generating circuit according to the present invention will be described. FIG. 2 is a diagram illustrating the configuration of a first embodiment of the CRC code generating circuit. The CRC code generating circuit 1 calculates a 32-bit CRC code for a sequence of successively output 128-bit parallel data. In the description of this specification, the number of bits in the parallel data and that in the CRC code are given for illustrative purposes, and are not restrictive of the embodiments given herein. The CRC code generating circuit 1 includes a CRC calculation unit 2, a correction unit 3, a shift register 4, a selector 5, and flip-flops 10 to 15.

Figure 3:
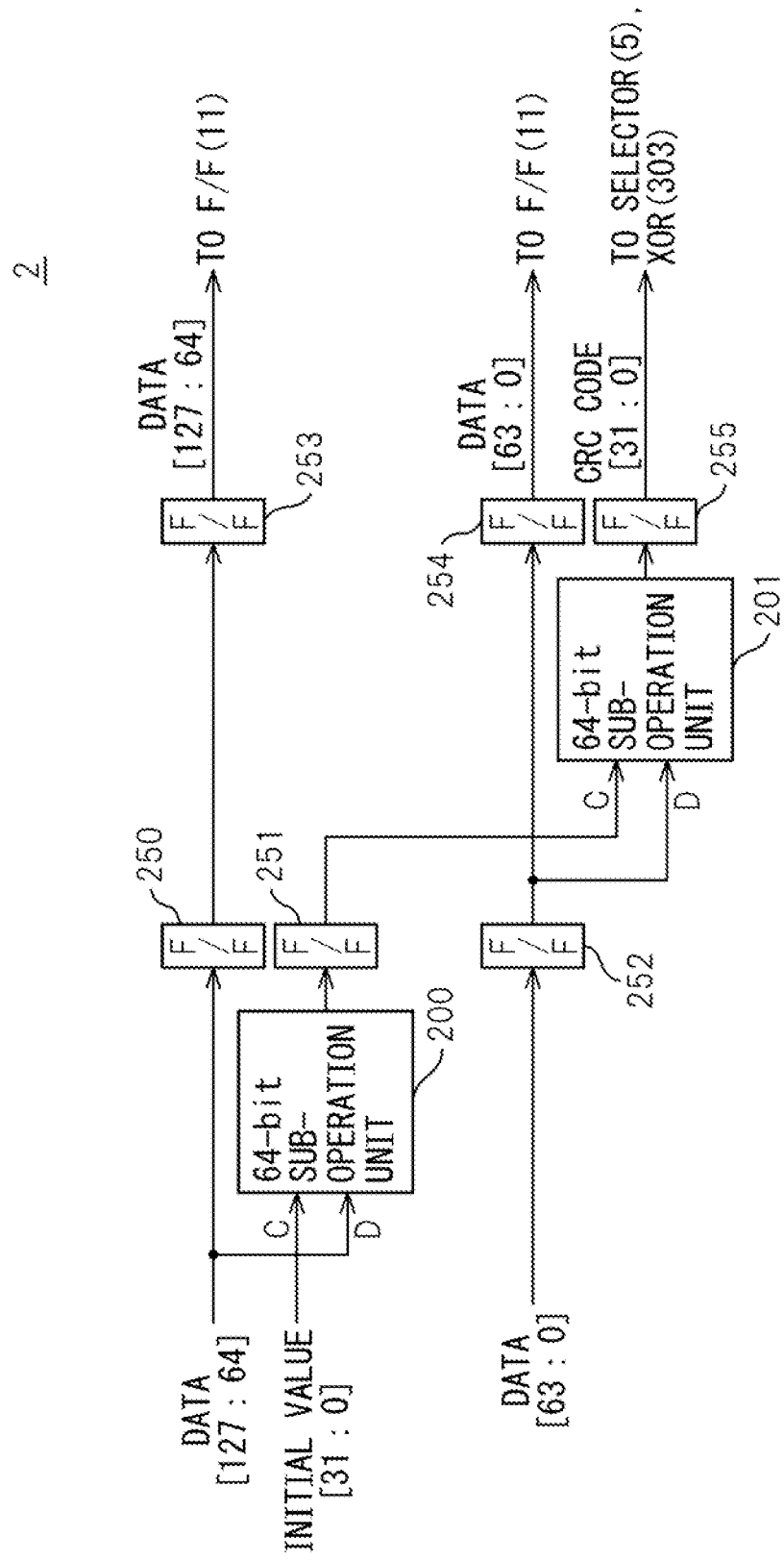
FIG. 3 is a diagram illustrating a configuration example of a CRC calculation unit depicted in FIG. 2.

The CRC calculation unit 2 calculates a CRC code for the parallel data successively input in each clock cycle. FIG. 3 is a diagram illustrating a configuration example of the CRC calculation unit 2 depicted in FIG. 2. The CRC calculation unit 2 includes 64-bit sub-operation units 200 and 201 and flip-flops 250 to 255.

The 64-bit sub-operation unit 200 performs the calculation of the CRC code for the high-order 64 bits of the 128-bit parallel data, and the 64-bit sub-operation unit 201 performs the calculation of the CRC code for the low-order 64 bits of the 128-bit parallel data. In the following description, the high-order 64 bits of the 128-bit parallel data may be designated as the "high-order data." Similarly, the low-order 64 bits of the 128-bit parallel data may be designated as the "low-order data."

The high-order and low-order data input in the same clock cycle and the CRC code calculated for the high-order data are held in the flip-flops 250, 252, and 251, respectively. The 64-bit sub-operation unit 201 calculates the CRC code for the low-order data in the next clock cycle, based on the low-order data held in the flip-flop 252 and the CRC code held in the 251.

That is, the 64-bit sub-operation units 200 and 201 perform in different pipeline stages the sub-operations into which the logic operation for calculating the CRC code for the 128-bit parallel data has been divided (decomposed) in the bit length direction of the parallel data. The flip-flops 250 to 252 together operate as a pipeline register separating between the pipeline stages.

By thus dividing the logic operation for calculating the CRC code into a plurality of sub-operations, the number of logic operation stages to be performed by the logic operation circuit that performs each sub-operation is made smaller than would be the case if it were not divided. Thus, the number of logic operation stages that the logic operation circuit performs during one clock cycle is reduced, serving to reduce the time needed to perform the logic operation in one clock cycle. As a result, in the CRC code generating circuit, it is easier to secure a timing margin that is to be allowed between the time the input signal is read out of a state logic element such as a flip-flop and the time the calculation result is stored in a state logic element.

However, when calculating the CRC code by pipelining such as described above, the calculation of the CRC code for one parallel data is performed over a plurality of clock cycles. It is therefore not possible to start the calculation of the next CRC code that is calculated using the earlier calculated CRC code.

In view of this, in the present embodiment, the CRC calculation unit 2 calculates the CRC code, based on the initial value and the parallel data. More specifically, the 64-bit sub-operation unit 200 calculates the CRC code, based on the initial value and the high-order data of the 128-bit parallel input data. Then, the correction unit 3 corrects the CRC code output from the CRC calculation unit 2, based on the initial value and the CRC code calculated preceding the current CRC code.

Then, the selector 5 selects, under the control of the start pulse SP, either the CRC code not corrected, i.e., the CRC code output from the 64-bit sub-operation unit 201 in the final pipeline stage of the CRC calculation unit 2, or the CRC code corrected by the correction unit 3. The selector 5 supplies the selected CRC code to the flip-flop 12.

Since there is no need to correct the CRC code calculated for the starting data of the parallel data, the selector 5 selects the CRC code output from the 64-bit sub-operation unit 201, as the CRC code calculated for the starting data of the parallel data. For data other than the starting data, the selector 5 selects the corrected CRC code output from the correction unit 3 as the CRC code calculated for that data.

Figure 4:
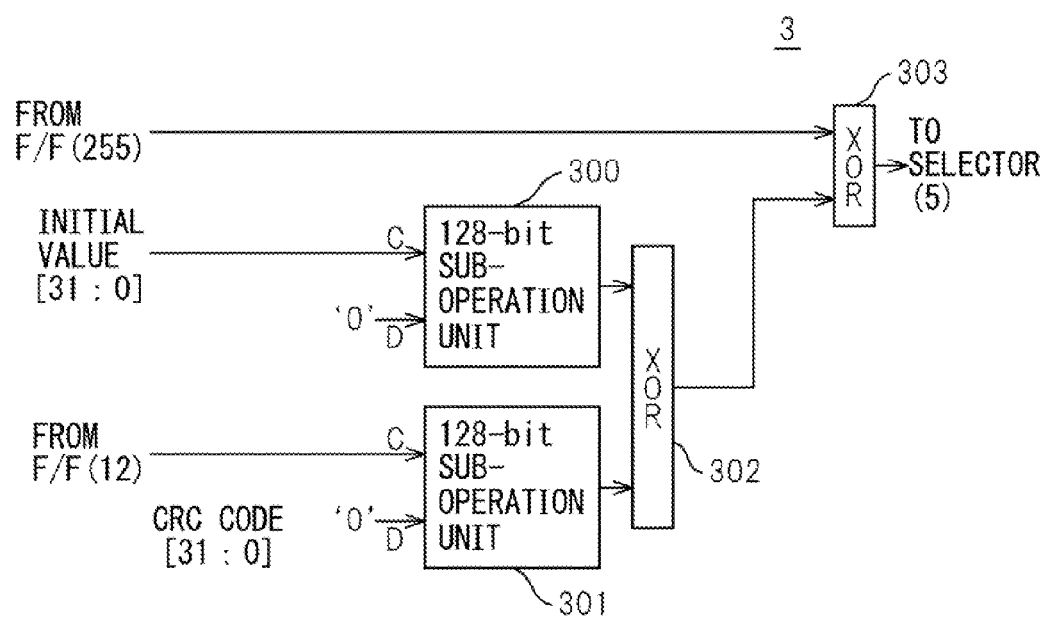
FIG. 4 is a diagram illustrating a configuration example of a correction unit depicted in FIG. 2.

FIG. 4 is a diagram illustrating a configuration example of the correction unit 3 depicted in FIG. 2. The correction unit 3 includes 128-bit sub-operation units 300 and 301 and XOR circuits 302 and 303. The CRC code output from the 64-bit sub-operation unit 201 in the final pipeline stage of the CRC calculation unit 2 and held in the flip-flop 255 is supplied to the correction unit 3 as the CRC code to be corrected.

Based on the initial value or the CRC code supplied via an input line "C", the 128-bit sub-operation units 300 and 301 each calculate the CRC code for 128-bit parallel data whose bit values are all 0s. The initial value is input on the input line "C" to the 128-bit sub-operation unit 300, while the CRC code output from the flip-flop 12 is input on the input line "C" to the 128-bit sub-operation unit 301. The CRC code output from the flip-flop 12 is one that is calculated one clock cycle earlier than the CRC code to be corrected.

The XOR circuit 302 outputs the exclusive-OR of the outputs of the 128-bit sub-operation units 300 and 301 to calculate the correction value to be applied to the CRC code for correction. The XOR circuit 303 outputs the exclusive-OR of the correction value with the CRC code to be corrected. That is, the XOR circuit 303 outputs the corrected CRC code by correcting the current CRC code with the correction value. The output of the XOR circuit 303 is placed on the input line "0" to the selector 5.

Next, the correction process performed by the correction unit 3 will be described. For simplicity, the following describes how the CRC code is corrected by taking as an example the case where the number of bits in the parallel data is 4 and the generating polynomial is "$1+X^2+X^5$". When the CRC code is calculated by using the initial value instead of using the CRC code (hereinafter, simply referred to as the "earlier CRC code") calculated one clock cycle earlier than the CRC code to be corrected, the resulting error DIFF will be as follows.

DIFF(0)=(d(3) xor d(0) xor c1(1) xor c1(4)) xor (d(3) xor d(0) xor c2(1) xor c2(4))

DIFF(1)=(d(1) xor c1(2)) xor (d(1) xor c2(2))

DIFF(2)=(d(3) xor d(2) xor d(0) xor c1(1) xor c1(3) xor c1(4)) xor (d(3) xor d(2) xor d(0) xor c2(1) xor c2(3) xor c2(4))

DIFF(3)=(d(3) xor d(1) xor c1(2) xor c1(4)) xor (d(3) xor d(1) xor c2(2) xor c2(4))

DIFF(4)=(d(2) xor c1(0) xor c1(3)) xor (d(2) xor c2(0) xor c2(3))

In the above expressions, DIFF(0) to DIFF(4) indicate the values of the first to fifth low-order bits of the error DIFF. On the other hand, d(0) to d(3) indicate the values of the first to fourth low-order bits of the parallel data. Further, c1(0) to c1(4) indicate the values of the first to fifth low-order bits of the initial value. Similarly, c2(0) to c2(4) indicate the values of the first to fifth low-order bits of the earlier CRC code.

By omitting the terms d(0) to d(3) relating to the parallel data, the errors DIFF(0) to DIFF(4) can be expressed as follows.

DIFF(0)=(c1(1) xor c1(4)) xor (c2(1) xor c2(4))

DIFF(1)=(c1(2)) xor (c2(2))

DIFF(2)=(c1(1) xor c1(3) xor c1(4)) xor (c2(1) xor c2(3) xor c2(4))

DIFF(3)=(c1(2) xor c1(4)) xor (c2(2) xor c2(4))

DIFF(4)=(c1(0) xor c1(3)) xor (c2(0) xor c2(3))

In the logic equations for calculating the error DIFF, the 128-bit sub-operation unit 300 calculates the terms formed by the XORs of the bits contained in the initial value. In the logic equations for calculating the error DIFF, the 128-bit sub-operation unit 301 calculates the terms formed by the XORs of the bits contained in the earlier CRC code. The XOR circuit 302 calculates the error DIFF, i.e., the correction value, by taking an XOR between the resulting two XORs.

Since the above logic expressions for the error DIFF do not contain the terms relating to the parallel data, the number of logic stages in the correction unit 3 does not depend on the value of the parallel data. Further, the number of logic stages in the correction unit 3 does not exceed twice the number of terms in the generating polynomial. As a result, in the logic operation circuit used in the correction unit 3 also, it is easier to secure a timing margin that is to be allowed between the time the input signal is read out of a state logic element and the time the calculation result is stored in a state logic element. If a fixed value is used as the initial value, the number of logic stages can be further reduced to reduce the amount of circuitry, because the logic operation to be performed by the 128-bit sub-operation unit 300 can be omitted.

Reference is made to FIG. 2. The shift register 4 includes flip-flops 400 to 403. The shift register 4 is used to synchronize the start pulse SP and the end pulse EP to the CRC code calculated by the CRC calculation unit 2 or the parallel data delayed through the CRC calculation unit 2.

Figure 5:
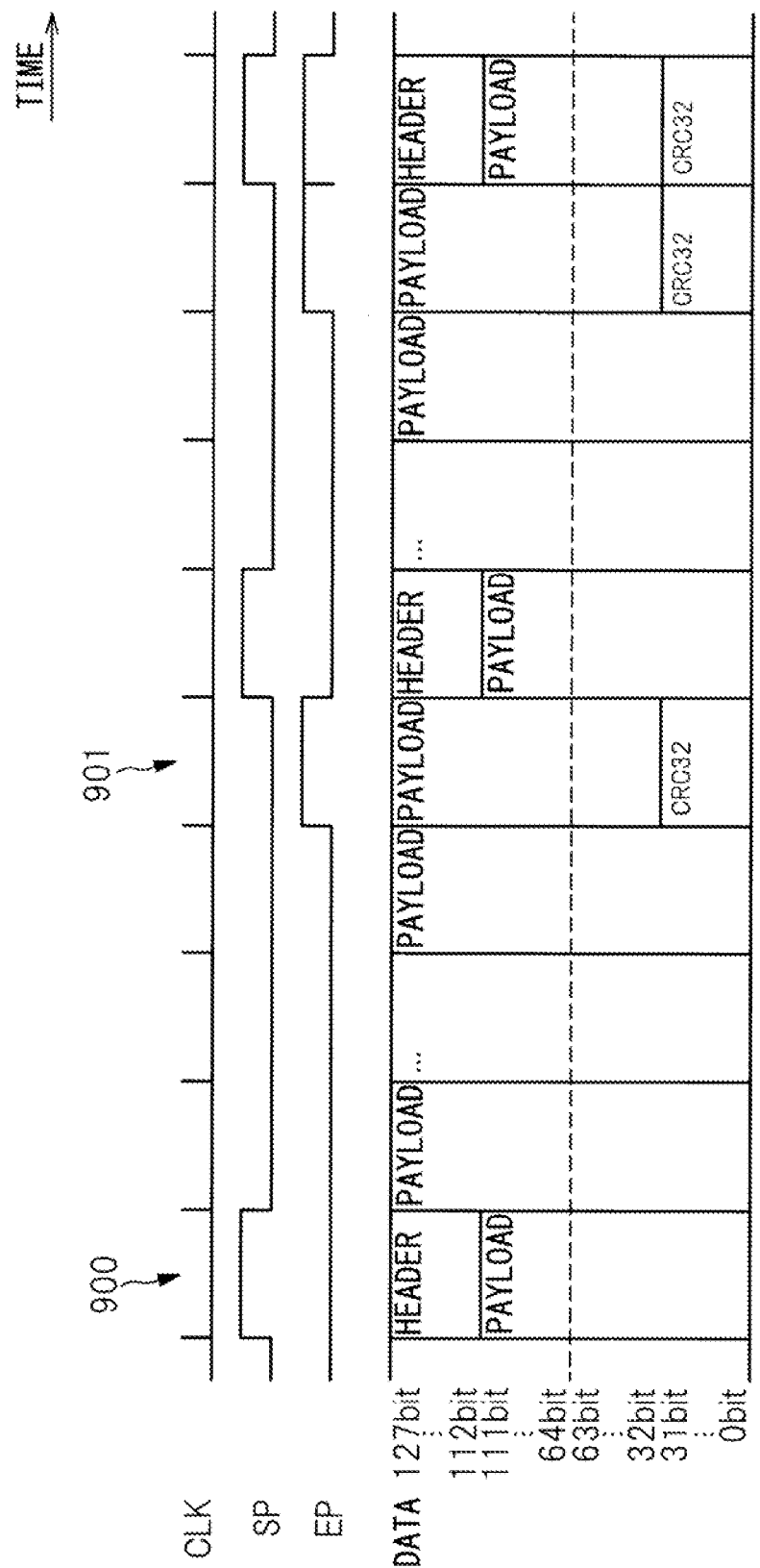
FIG. 5 is a timing chart illustrating a first example of a data format.

The CRC code generating circuit 1 of FIG. 2 is used for the parallel data having the data format depicted in FIG. 5. FIG. 5 is a timing chart illustrating a first example of the data format. In FIG. 5, the first row indicates the timing for generating clock timing edge, the second row indicates the start pulse SP, and the third row indicates the end pulse EP.

The fourth row of FIG. 5 indicates the parallel data. "HEADER" in the data denotes the header information appended at the beginning of the parallel data, and "CRC32" in the data denotes the CRC code. In the illustrated format example, the header is inserted in the high-order data. The CRC code is inserted in the low-order data of the parallel data. For example, when the input of given parallel data is started in clock cycle 900, the start pulse SP is asserted in clock cycle 900. The header is inserted in the high-order data in clock cycle 900.

In clock cycle 901, the end pulse EP is asserted, which indicates that the CRC code is inserted in the low-order data of the parallel data in clock cycle 901.

According to the present embodiment, the number of logic operation stages that the logic operation circuit used in the CRC code generating circuit 1 performs during one clock cycle is reduced. As a result, in the CRC code generating circuit 1, it is easier to secure a timing margin that is to be allowed between the time the input signal is read out of a state logic element such as a flip-flop and the time the calculation result is stored in a state logic element.

Further, as will be described below, the number of divisions of the logic operation for the CRC code is not limited to 2. The CRC calculation unit 2 may divide the logic operation for the CRC code into three or more sub-operations. When the number of divisions of the logic operation for the CRC code is increased, the number of state logic elements such as flip-flops increases, increasing the amount of circuitry. However, the number of divisions can be easily optimized according to the design conditions.

Next, another embodiment of the CRC code generating circuit will be described. In the case of the CRC code generating circuit 1 of FIG. 2, the 128-bit parallel data has been divided into two equal parts for pipeline processing, but the parallel data may be divided into three or more parts. Further, the parallel data may be divided so that, in different pipeline stages, CRC code calculations are performed on different numbers of bits.

Figure 6:
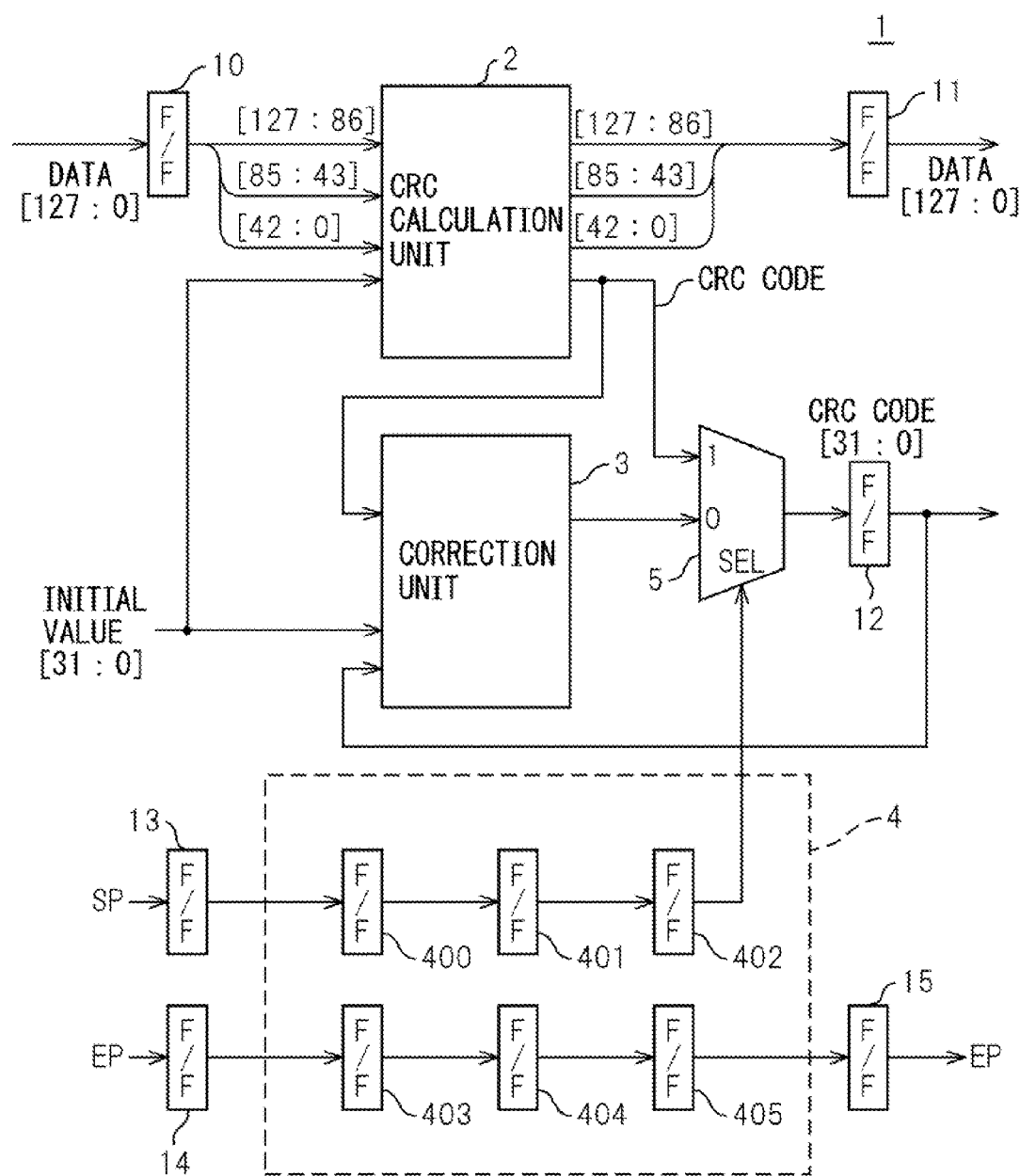
FIG. 6 is a diagram illustrating the configuration of a second embodiment of the CRC code generating circuit.

FIG. 6 is a diagram illustrating the configuration of a second embodiment of the CRC code generating circuit. Unless otherwise defined, component elements similar to those in FIG. 2 are designated by the same reference numerals as those used in FIG. 2.

The CRC calculation unit 2 divides the calculation of the CRC code for the 128-bit parallel data into three sub-operations. One of the sub-operations concerns the calculation of the CRC code for the first to 43rd bits (43 bits in total) in the parallel data. Another one of the sub-operations concerns the calculation of the CRC code for the 44th to 86th bits (43 bits in total) in the parallel data. The remaining sub-operation concerns the calculation of the CRC code for the 87th to 128th bits (42 bits in total) in the parallel data. In the following description, the 87th to 128th bits in the parallel data may be designated as the "first sub-data." Similarly, the 44th to 86th bits in the parallel data may be designated as the "second sub-data." Further, the first to 43rd bits in the parallel data may be designated as the "third sub-data."

The shift register 4 includes flip-flops 400 to 405. The shift register 4 is used to synchronize the start pulse SP and the end pulse EP to the CRC code calculated by the CRC calculation unit 2 or the parallel data delayed through the CRC calculation unit 2.

Figure 7:
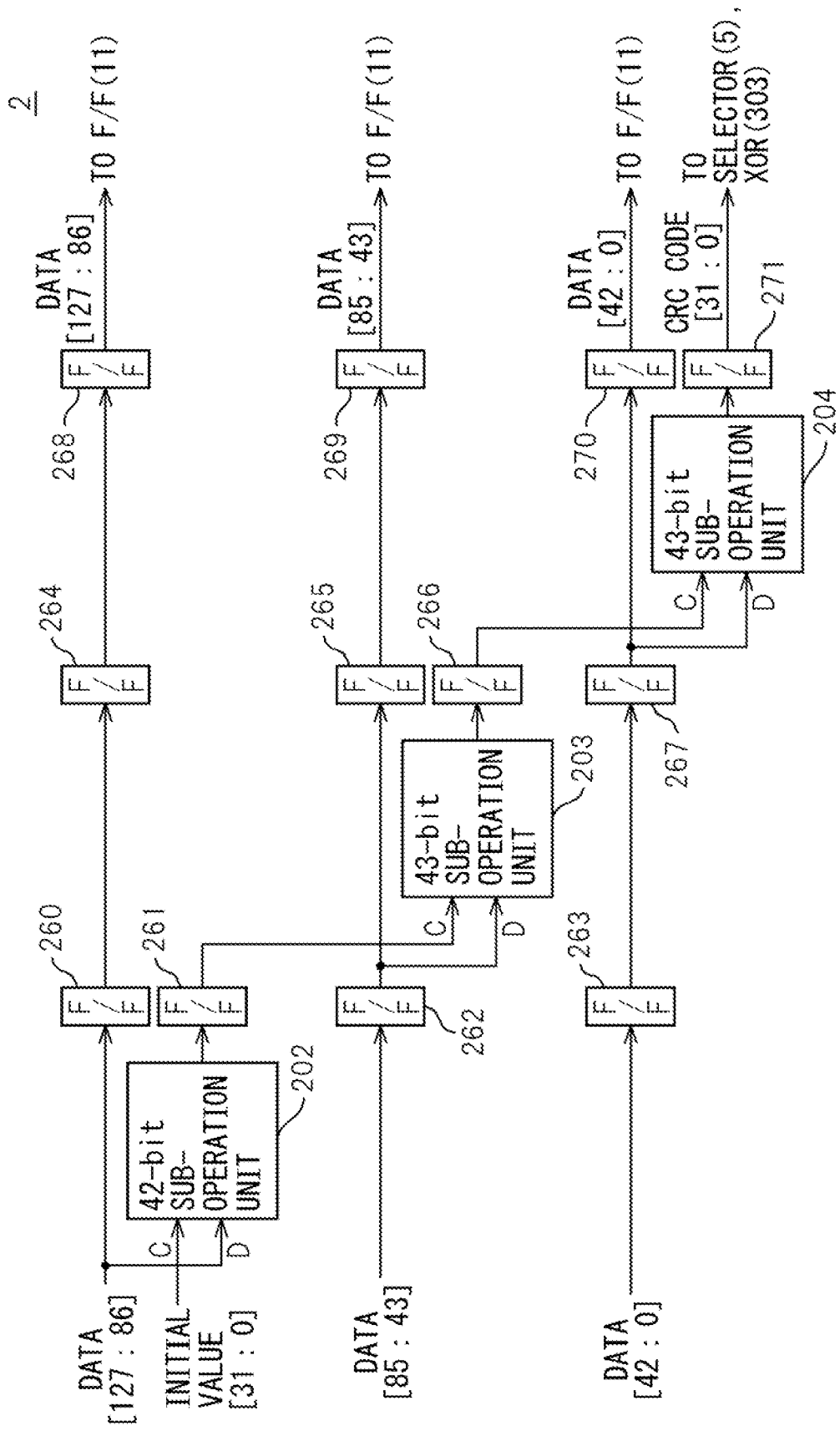
FIG. 7 is a diagram illustrating a configuration example of a CRC calculation unit depicted in FIG. 6.

FIG. 7 is a diagram illustrating a configuration example of the CRC calculation unit 2 depicted in FIG. 6. The CRC calculation unit 2 includes a 42-bit sub-operation unit 202, 43-bit sub-operation units 203 and 204, and flip-flops 260 to 271. The 42-bit sub-operation unit 202 performs the calculation of the CRC code for the first sub-data. The 43-bit sub-operation unit 203 performs the calculation of the CRC code for the second sub-data. The 43-bit sub-operation unit 204 performs the calculation of the CRC code for the third sub-data.

The first, second, and third sub-data input in the same clock cycle and the CRC code calculated for the first sub-data are held in the flip-flops 260, 262, 263, and 261, respectively. In the next clock cycle, the 43-bit sub-operation unit 203 calculates the CRC code for the second sub-data, based on the second sub-data held in the flip-flop 262 and the CRC code held in the flip-flop 261.

Next, the first, second, and third sub-data input in the same clock cycle and the CRC code calculated for the second sub-data are held in the flip-flops 264, 265, 267, and 266, respectively. In the next clock cycle, the 43-bit sub-operation unit 204 calculates the CRC code for the third sub-data, based on the third sub-data held in the flip-flop 267 and the CRC code held in the flip-flop 266.

That is, the 42-bit sub-operation unit 202 and the 43-bit sub-operation units 203 and 204 perform in different pipeline stages the sub-operations into which the logic operation for the calculation of the CRC code for the 128-bit parallel data has been divided (decomposed) in the bit length direction of the parallel data. The flip-flops 260 to 267 operate as pipeline registers separating between the respective pipeline stages.

According to the present embodiment, the CRC code can be calculated by dividing the logic operation for the CRC code into three or more sub-operations and using the technique of pipeline processing. By increasing the number of divisions of the logic operation, the number of logic operation stages that the logic operation circuit performs during one clock cycle can be further reduced.

Figure 8:
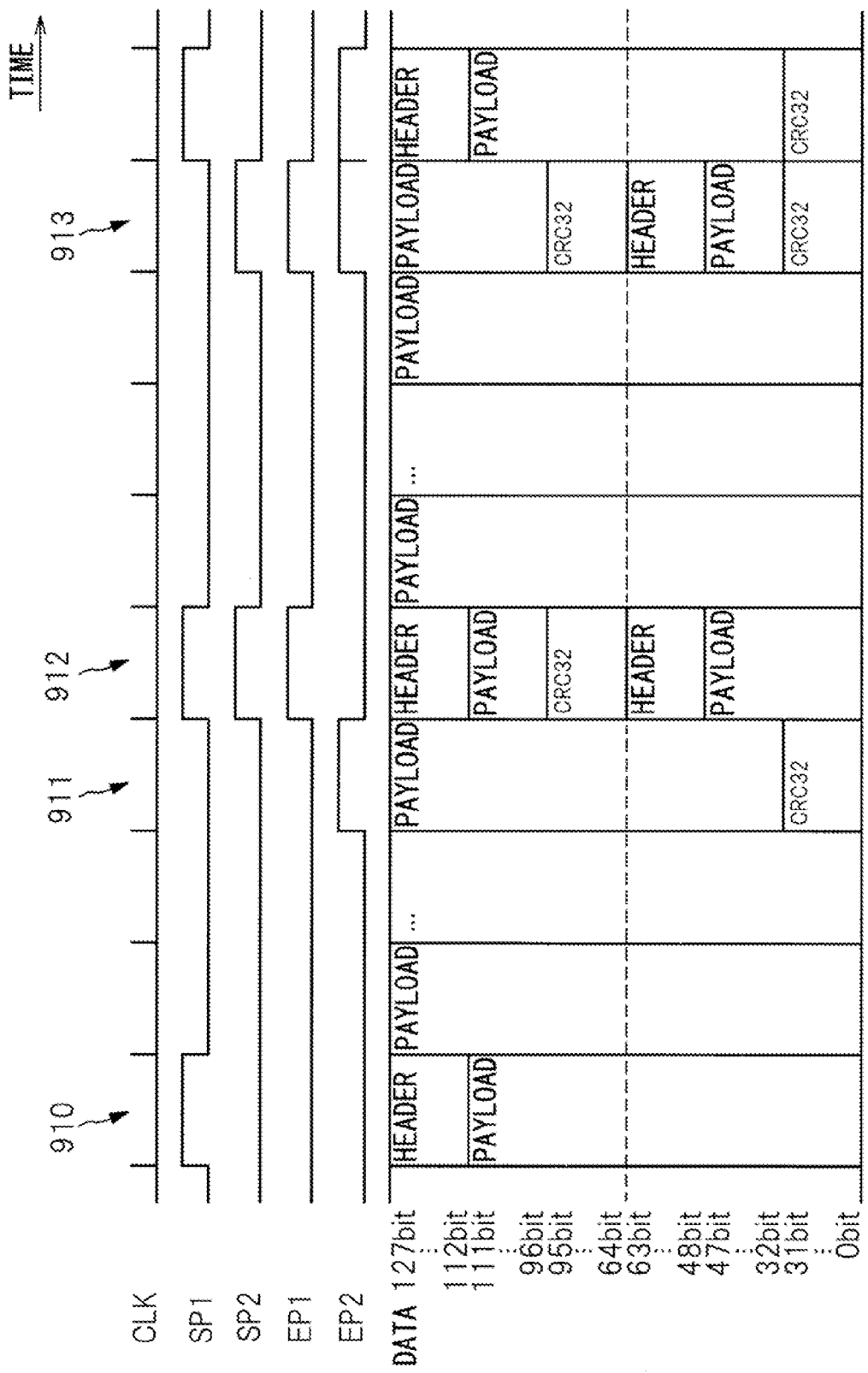
FIG. 8 is an explanatory diagram illustrating a second example of the data format.

Next, another embodiment of the CRC code generating circuit will be described. FIG. 8 is an explanatory diagram illustrating a second example of the data format. In FIG. 8, the first row indicates the timing for generating a clock timing edge, the second row indicates a first start pulse SP1, and the third row indicates a second start pulse SP2. The fourth row of FIG. 8 indicates a first end pulse EP1, and the fifth row indicates a second end pulse EP2.

The sixth row of FIG. 8 indicates the parallel data. "HEADER" in the data denotes the header information appended at the beginning of the parallel data, and "CRC32" in the data denotes the CRC code. In the illustrated format example, the header and the CRC code may both be inserted in either the high-order data or the low-order data.

The first start pulse SP1 is asserted in the clock cycle in which the high-order data contains the beginning of the parallel data. The second start pulse SP2 is asserted in the clock cycle in which the low-order data contains the beginning of the parallel data. The first end pulse EP1 is asserted in the clock cycle in which the CRC code is inserted in the high-order data. The second end pulse EP2 is asserted in the clock cycle in which the CRC code is inserted in the low-order data.

For example, if, in clock cycle 910, the high-order data contains the beginning of the parallel data, the first start pulse SP1 is asserted in clock cycle 910. The header is inserted in the high-order data in clock cycle 910. In clock cycle 911, the second end pulse EP2 is asserted, which indicates that the CRC code is inserted in the low-order data of the parallel data in clock cycle 911.

Further, for example, if, in clock cycle 912, the low-order data contains the beginning of the parallel data, the second start pulse SP2 is asserted in clock cycle 912. The header is inserted in the low-order data in clock cycle 912. In clock cycle 913, the first end pulse EP1 is asserted, which indicates that the CRC code is inserted in the high-order data in clock cycle 913.

Figure 9:
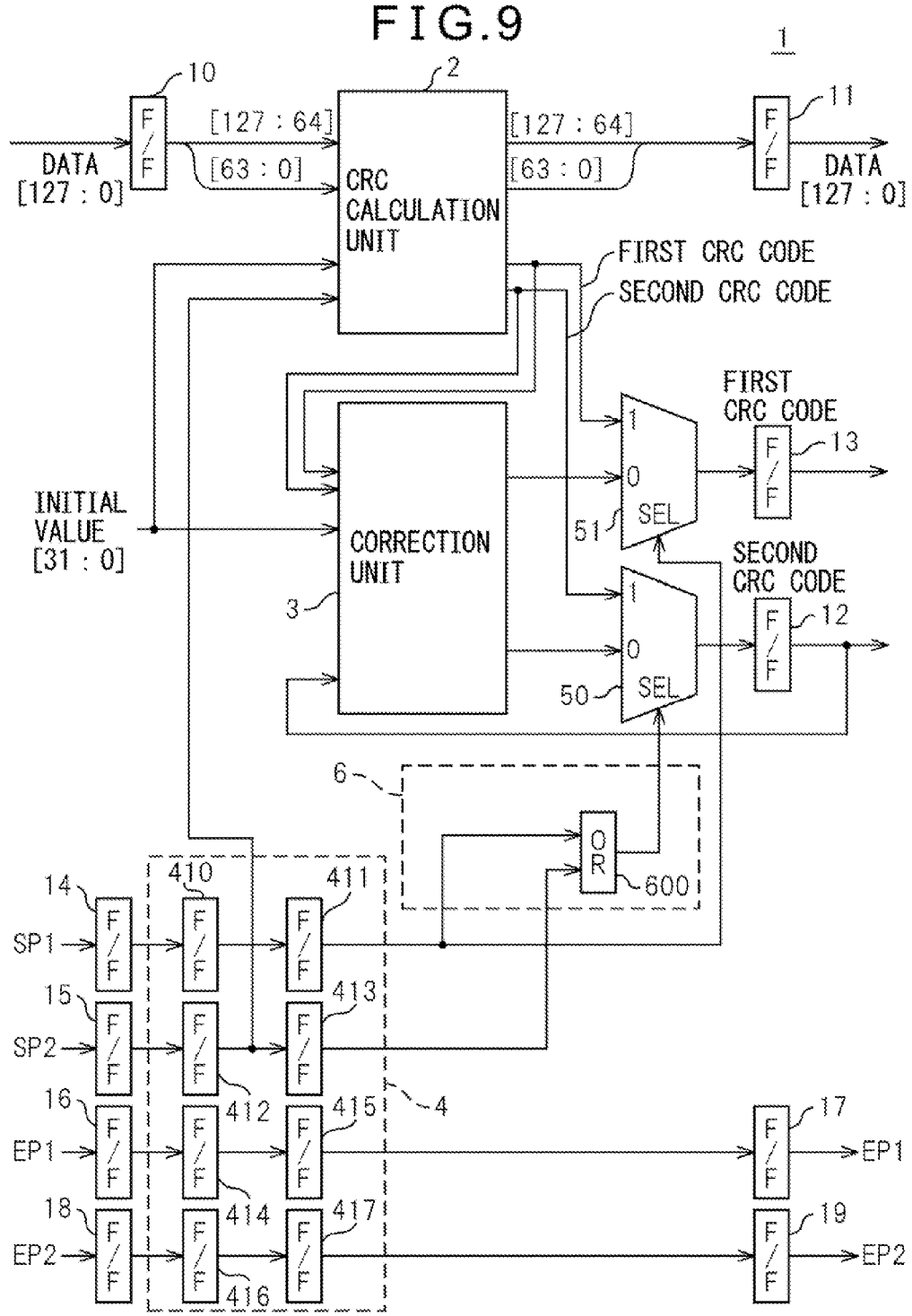
FIG. 9 is a diagram illustrating the configuration of a third embodiment of the CRC code generating circuit.

FIG. 9 is a diagram illustrating the configuration of an embodiment of the CRC code generating circuit that calculates the CRC code for the data of the format depicted in FIG. 8. Unless otherwise defined, components elements similar to those in FIG. 2 are designated by the same reference numerals as those used in FIG. 2. The CRC code generating circuit 1 here includes a CRC calculation unit 2, a correction unit 3, a shift register 4, selectors 50 and 51, a select signal generating unit 6, and flip-flops 10 to 19.

The shift register 4 includes flip-flops 410 to 417. The shift register 4 is used to synchronize the first start pulse SP1, the second start pulse SP2, the first end pulse EP1, and the second end pulse EP2 to the CRC code calculated by the CRC calculation unit 2 or the parallel data delayed through the CRC calculation unit 2.

The CRC calculation unit 2 supplies a first CRC code, generated for insertion in the high-order data, to the selector 51 as well as to the correction unit 3. Further, the CRC calculation unit 2 supplies a second CRC code, generated for insertion in the low-order data, to the selector 50 as well as to the correction unit 3.

Figure 10:
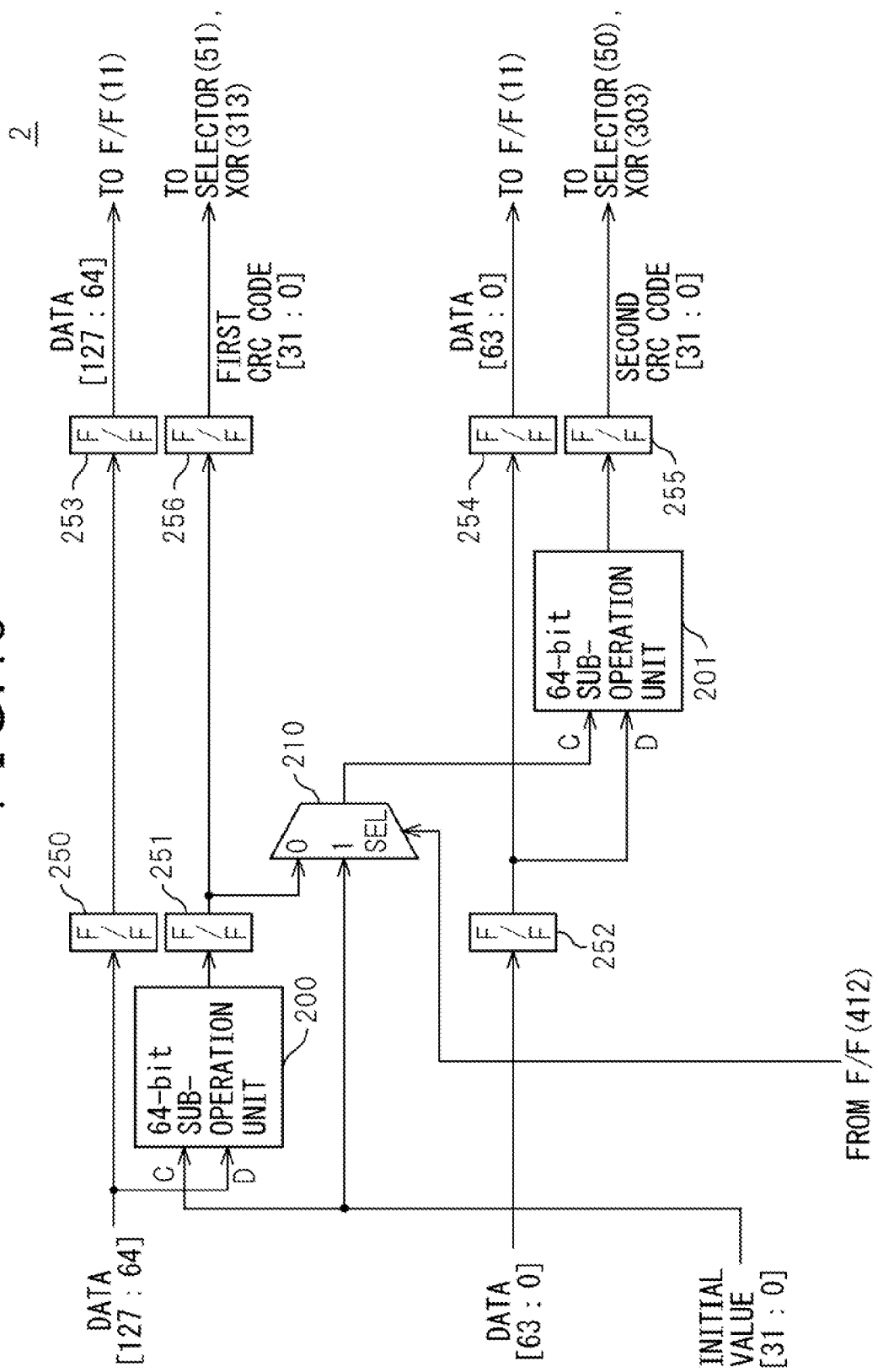
FIG. 10 is a diagram illustrating a configuration example of a CRC calculation unit depicted in FIG. 9.

FIG. 10 is a diagram illustrating a configuration example of the CRC calculation unit 2 depicted in FIG. 9. Components elements similar to those in FIG. 3 are designated by the same reference numerals as those used in FIG. 3. The CRC calculation unit 2 includes 64-bit sub-operation units 200 and 201, flip-flops 250 to 256, and a selector 210.

The CRC code calculated by the 64-bit sub-operation unit 200 is output as the first CRC code after being held in the flip-flops 251 and 256 in this order. Similarly, the CRC code calculated by the 64-bit sub-operation unit 201 is output as the second CRC code after being held in the flop-flop 255.

The second start pulse SP2 delayed through the flip-flop 412 is applied as the select signal to the selector 210. The amount by which the second start pulse SP2 is delayed through the flip-flop 412 is equal to the amount by which the data and the calculation result from the 64-bit sub-operation unit 200 are delayed through the respective flip-flops 250 to 252. The selector 210 selects either the initial value or the calculation result from the 64-bit sub-operation unit 200 in accordance with the value of the second start pulse SP2, and supplies the selected one to the 64-bit sub-operation unit 201. The selector 210 here is given as one example of the second selector described in the appended claims.

Accordingly, when the second start pulse SP2 is not asserted, the CRC calculation unit 2 operates in the same manner as the CRC calculation unit 2 depicted in FIG. 3. When the second start pulse SP2 is asserted, the 64-bit sub-operation unit 201 calculates the CRC code by using the initial value and the low-order data in a manner similar to the 64-bit sub-operation unit 200 that calculates the CRC code by using the initial value and the high-order data. In this way, even when the low-order data contains the beginning of the parallel data, the CRC calculation unit 2 can start the calculation of the CRC code.

Reference is made to FIG. 9. The first and second CRC codes are corrected by the correction unit 3 and supplied to the selectors 51 and 50, respectively. The selector 51 selects, under the control of the first start pulse SP1, either the uncorrected first CRC code, that is, the first CRC code output from the 64-bit sub-operation unit 200, or the first CRC code corrected by the correction unit 3.

When inserting the first CRC code in the high-order data containing the beginning of the parallel data, there is no need to correct the first CRC code. Accordingly, when the first start pulse SP1 is asserted, the selector 51 selects the uncorrected first CRC code. When the first start pulse SP1 is not asserted, the selector 51 selects the corrected first CRC code. The selector 51 supplies the selected first CRC code to the flip-flop 13.

On the other hand, there is no need to correct the second CRC code to be inserted in the low-order data in the clock cycle in which either the high-order data or the low-order data contains the beginning of the parallel data. For this purpose, the select signal generating circuit 6 includes an OR circuit 600 which calculates the OR of the first start pulse SP1 with the second start pulse SP2 and outputs the calculated logical add (OR) as the select signal to the selector 50.

When the select signal is asserted, the selector 50 selects the uncorrected second CRC code. When the select signal is not asserted, the selector 50 selects the corrected second CRC code. The selector 50 supplies the selected second CRC code to the flip-flop 12.

Figure 11:
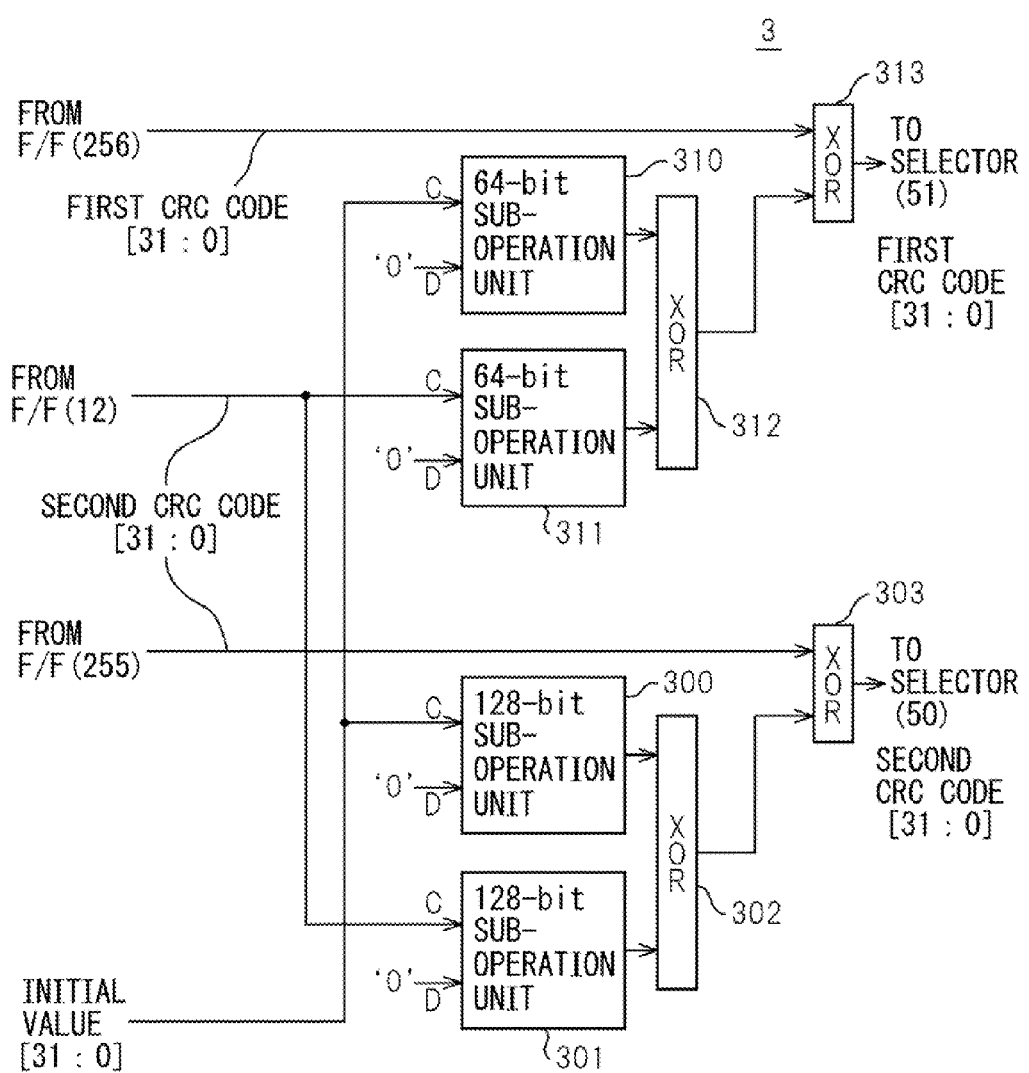
FIG. 11 is a diagram illustrating a configuration example of a correction unit depicted in FIG. 9.

FIG. 11 is a diagram illustrating a configuration example of the correction unit 3 depicted in FIG. 9. Components elements similar to those in FIG. 4 are designated by the same reference numerals as those used in FIG. 4. The correction unit 3 includes 128-bit sub-operation units 300 and 301 and XOR circuits 302 and 303. The correction unit 3 further includes 64-bit sub-operation units 310 and 311 and XOR circuits 312 and 313.

The CRC code output from the 64-bit sub-operation unit 200 in the CRC calculation unit 2 and held in the flip-flop 256 is supplied to the correction unit 3 as the first CRC code to be corrected. The CRC code output from the 64-bit sub-operation unit 201 in the final pipeline stage of the CRC calculation unit 2 and held in the flip-flop 255 is supplied to the correction unit 3 as the second CRC code to be corrected.

The 128-bit sub-operation units 300 and 301 and XOR circuits 302 and 303 correct the second CRC code and produce the corrected second CRC code. The output of the XOR circuit 303 is placed on the input line "0" to the selector 50. The 128-bit sub-operation units 300 and 301 and the XOR circuits 302 and 303 are together given as one example of the second correction unit described in the appended claims.

The 64-bit sub-operation units 310 and 311 are each identical in function to the 128-bit sub-operation unit 300, except that the number of bits in the parallel data for which the CRC code is calculated is 64. The initial value is input on the input line "C" to the 64-bit sub-operation unit 310, while the second CRC code output from the flip-flop 12 is input on the input line "C" to the 64-bit sub-operation unit 311. The second CRC code output from the flip-flop 12 is one that is calculated one clock cycle earlier than the first CRC code to be corrected.

The XOR circuit 312 calculates the exclusive-OR of the outputs of the 64-bit sub-operation units 310 and 311 to calculate the correction value to be applied to the first CRC code for correction. The XOR circuit 313 outputs the exclusive-OR of the correction value with the first CRC code to be corrected. That is, the XOR circuit 313 outputs the corrected first CRC code by correcting the first CRC code with the correction value. The output of the XOR circuit 313 is placed on the input line "0" to the selector 51. The 64-bit sub-operation units 310 and 311 and the XOR circuits 312 and 313 are together given as one example of the first correction unit described in the appended claims.

According to the present embodiment, the CRC code can be generated even for the data having such a data format that allows both the header and the CRC code to be inserted in either the high-order data and the low-order data.

Figure 12:
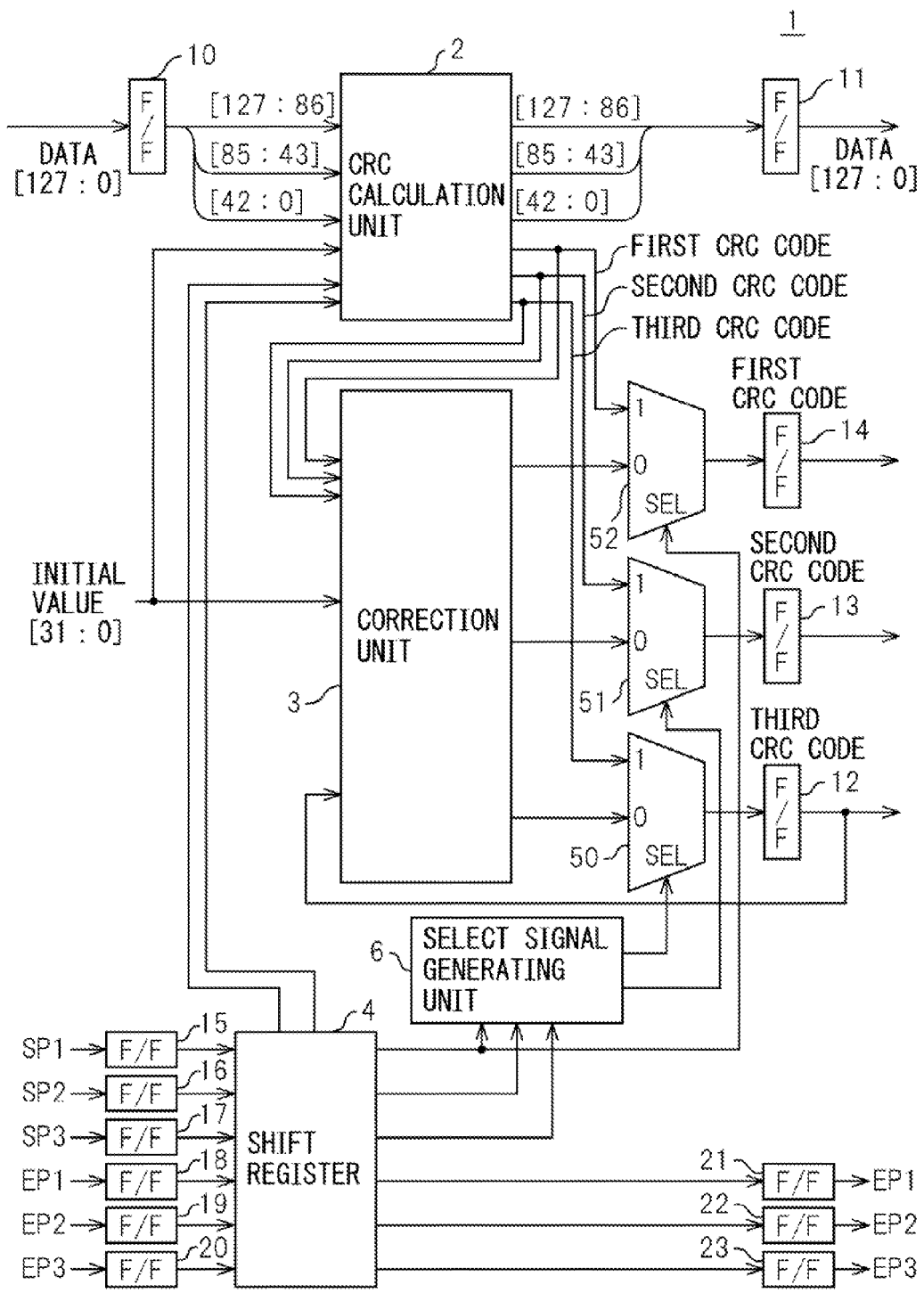
FIG. 12 is a diagram illustrating the configuration of a fourth embodiment of the CRC code generating circuit.

Next, another embodiment of the CRC code generating circuit will be described. FIG. 12 is a diagram illustrating the configuration of a fourth embodiment of the CRC code generating circuit. In the case of the CRC code generating circuit 1 of FIG. 9, the 128-bit parallel data has been divided into two equal parts for pipeline processing, but the parallel data may be divided into three or more parts. Further, the parallel data may be divided so that, in different pipeline stages, CRC code calculations are performed on different numbers of bits. Furthermore, the beginning of the parallel data and the CRC code may be inserted in any divided part of the data.

Unless otherwise defined, components elements similar to those in FIG. 9 are designated by the same reference numerals as those used in FIG. 9. The CRC code generating circuit 1 includes a CRC calculation unit 2, a correction unit 3, a shift register 4, selectors 50 to 53, a select signal generating unit 6, and flip-flops 10 to 23.

The CRC calculation unit 2 divides the calculation of the CRC code for the 128-bit parallel data into three sub-operations. Each sub-operation concerns the calculation of the CRC code for a designated one of the first to third sub-data.

Figure 13:
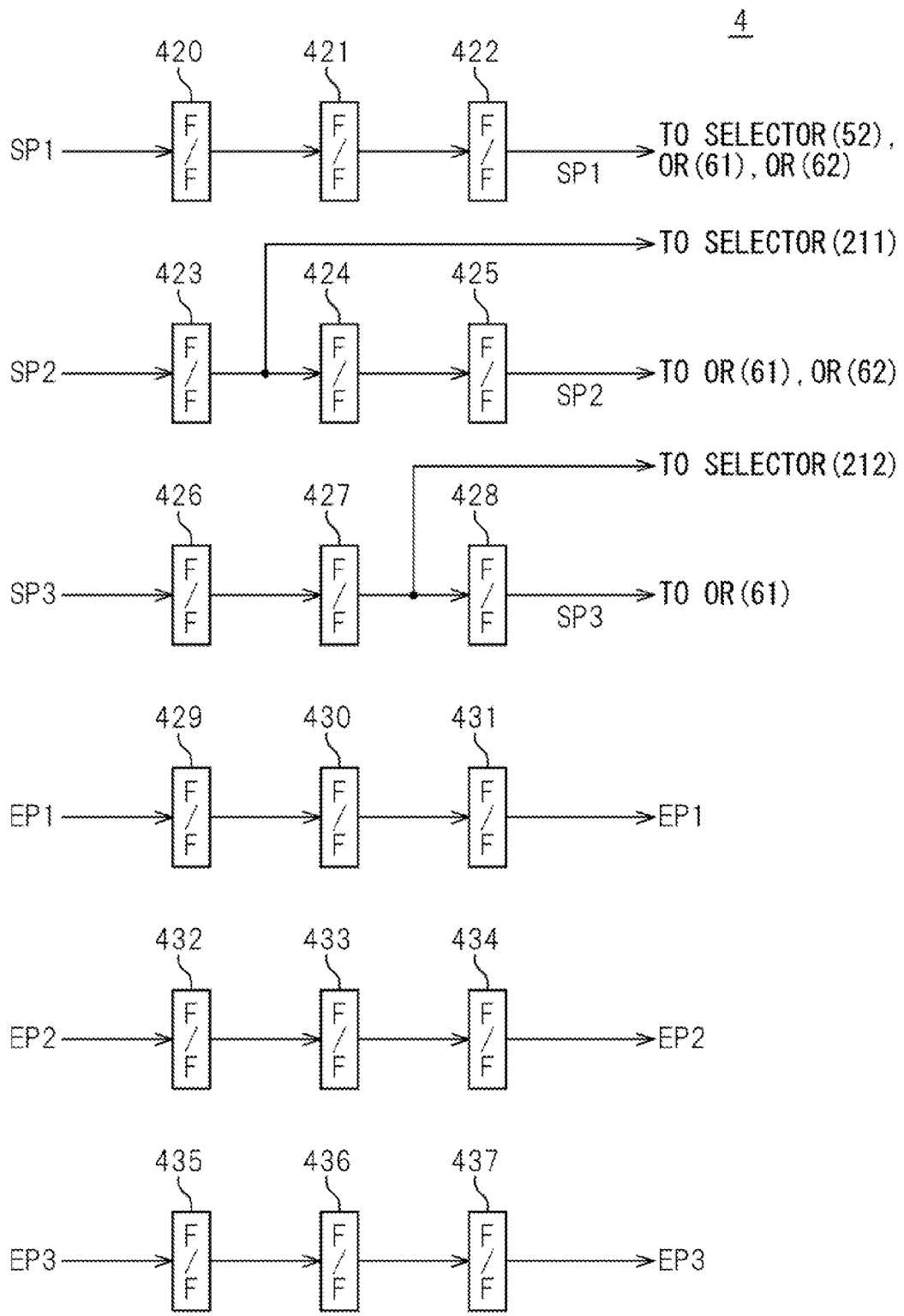
FIG. 13 is a diagram illustrating a configuration example of a shift register depicted in FIG. 12.

FIG. 13 is a diagram illustrating a configuration example of the register 4 depicted in FIG. 12. The register 4 includes flip-flops 420 to 437. The shift register 4 is used to synchronize a first start pulse SP1, a second start pulse SP2, a third start pulse SP3, a first end pulse EP1, a second end pulse EP2, and a third end pulse EP3 to the CRC code calculated by the CRC calculation unit 2 or the parallel data delayed through the CRC calculation unit 2.

The first start pulse SP1 is asserted in the clock cycle in which the first sub-data contains the beginning of the parallel data. The second start pulse SP2 is asserted in the clock cycle in which the second sub-data contains the beginning of the parallel data. The third start pulse SP3 is asserted in the clock cycle in which the third sub-data contains the beginning of the parallel data.

The first end pulse EP1 is asserted in the clock cycle in which the CRC code is inserted in the first sub-data. The second end pulse EP2 is asserted in the clock cycle in which the CRC code is inserted in the second sub-data. The third end pulse EP3 is asserted in the clock cycle in which the CRC code is inserted in the third sub-data.

The CRC calculation unit 2 supplies a first CRC code, generated for insertion in the first sub-data, to the selector 52 as well as to the correction unit 3. Further, the CRC calculation unit 2 supplies a second CRC code, generated for insertion in the second sub-data, to the selector 51 as well as to the correction unit 3. Furthermore, the CRC calculation unit 2 supplies a third CRC code, generated for insertion in the third sub-data, to the selector 50 as well as to the correction unit 3.

Figure 14:
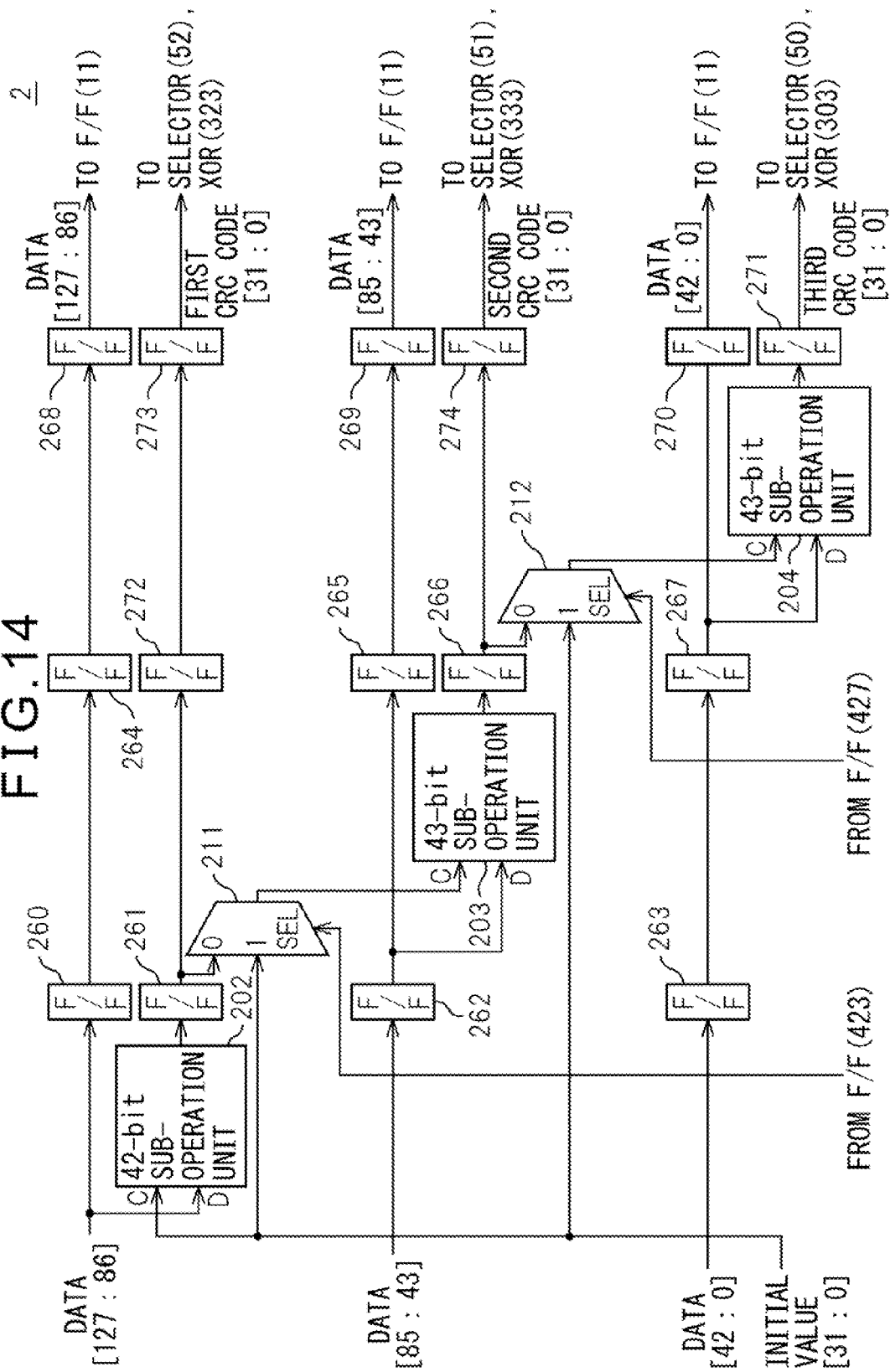
FIG. 14 is a diagram illustrating a configuration example of a CRC calculation unit depicted in FIG. 12.

FIG. 14 is a diagram illustrating a configuration example of the CRC calculation unit 2 depicted in FIG. 12. Components elements similar to those in FIG. 7 are designated by the same reference numerals as those used in FIG. 7. The CRC calculation unit 2 includes a 42-bit sub-operation unit 202, 43-bit sub-operation units 203 and 204, flip-flops 260 to 274, and selectors 211 and 212.

The CRC code calculated by the 42-bit sub-operation unit 202 is output as the first CRC code after being held in the flip-flops 261, 272, and 273 in this order. Similarly, the CRC code calculated by the 43-bit sub-operation unit 203 is output as the second CRC code after being held in the flip-flops 266 and 274 in this order. Further, the CRC code calculated by the 43-bit sub-operation unit 204 is output as the third CRC code after being held in the flip-flop 271.

The second start pulse SP2 delayed through the flip-flop 423 in FIG. 13 is applied as the select signal to the selector 211. The amount by which the second start pulse SP2 is delayed through the flip-flop 423 is equal to the amount by which the data and the calculation result from the 42-bit sub-operation unit 202 are delayed through the respective flip-flops 260 to 263. The selector 211 selects either the initial value or the calculation result from the 42-bit sub-operation unit 202 in accordance with the value of the second start pulse SP2, and supplies the selected one to the 43-bit sub-operation unit 203.

The third start pulse SP3 delayed through the flip-flop 427 in FIG. 13 is applied as the select signal to the selector 212. The amount by which the third start pulse SP3 is delayed through the flip-flop 427 is equal to the amount by which the data and the calculation result from the 43-bit sub-operation unit 203 are delayed through the respective flip-flops 260 to 267. The selector 212 selects either the initial value or the calculation result from the 43-bit sub-operation unit 203 in accordance with the value of the third start pulse SP3, and supplies the selected one to the 43-bit sub-operation unit 204.

Accordingly, when neither the second start pulse SP2 nor the third start pulse SP3 is asserted, the CRC calculation unit 2 operates in the same manner as the CRC calculation unit 2 depicted in FIG. 7. When the second start pulse SP2 is asserted, the 43-bit sub-operation unit 203 calculates the CRC code by using the initial value and the second sub-data in a manner similar to the 42-bit sub-operation unit 202 that calculates the CRC code by using the initial value and the first sub-data. In this way, even when the second sub-data contains the beginning of the parallel data, the CRC calculation unit 2 can start the calculation of the CRC code.

When the third start pulse SP3 is asserted, the 43-bit sub-operation unit 204 calculates the CRC code by using the initial value and the third sub-data. In this way, even when the third sub-data contains the beginning of the parallel data, the CRC calculation unit 2 can start the calculation of the CRC code.

Reference is made to FIG. 12. The first to third CRC codes are corrected by the correction unit 3 and supplied to the selectors 52 to 50, respectively. The selector 52 selects, under the control of the first start pulse SP1, either the uncorrected first CRC code, that is, the first CRC code output from the 42-bit sub-operation unit 202, or the first CRC code corrected by the correction unit 3. When the first start pulse SP1 is asserted, the selector 52 selects the uncorrected first CRC code. When the first start pulse SP1 is not asserted, the selector 52 selects the corrected first CRC code. The selector 52 supplies the selected first CRC code to the flip-flop 14.

On the other hand, the selector 51 selects, under the control of the select signal from the select signal generating unit 6, either the uncorrected second CRC code, i.e., the second CRC code output from the 43-bit sub-operation unit 203, or the second CRC code corrected by the correction unit 3. When the select signal is asserted, the selector 51 selects the uncorrected second CRC code. When the select signal is not asserted, the selector 51 selects the corrected second CRC code. The selector 51 supplies the selected second CRC code to the flip-flop 13.

Similarly, the selector 50 selects, under the control of the select signal from the select signal generating unit 6, either the uncorrected third CRC code, i.e., the third CRC code output from the 43-bit sub-operation unit 204, or the third CRC code corrected by the correction unit 3. When the select signal is asserted, the selector 50 selects the uncorrected third CRC code. When the select signal is not asserted, the selector 50 selects the corrected third CRC code. The selector 50 supplies the selected third CRC code to the flip-flop 12.

Figure 15:
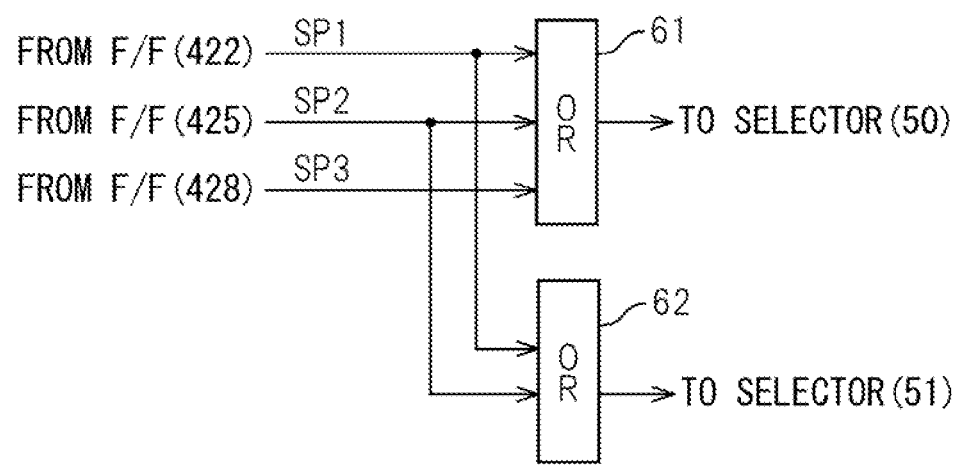
FIG. 15 is a diagram illustrating a configuration example of a select signal generating unit depicted in FIG. 12.

FIG. 15 is a diagram illustrating a configuration example of the select signal generating unit 6 depicted in FIG. 12. There is no need to correct the second CRC code to be inserted in the second sub-data in the clock cycle in which either the first sub-data or the second sub-data contains the beginning of the parallel data. For this purpose, the select signal generating circuit 6 includes an OR circuit 62 which calculates the OR of the first start pulse SP1 with the second start pulse SP2 and outputs the result of the calculated logical add (OR) as the select signal to the selector 51.

Further, there is no need to correct the third CRC code to be inserted in the third sub-data in the clock cycle in which one of the first to third sub-data contains the beginning of the parallel data. For this purpose, the select signal generating circuit 6 includes an OR circuit 61 which calculates the OR among the first start pulse SP1, the second start pulse SP2, and the third start pulse SP3 and outputs the calculated logical add (OR) as the select signal to the selector 50.

Figure 16:
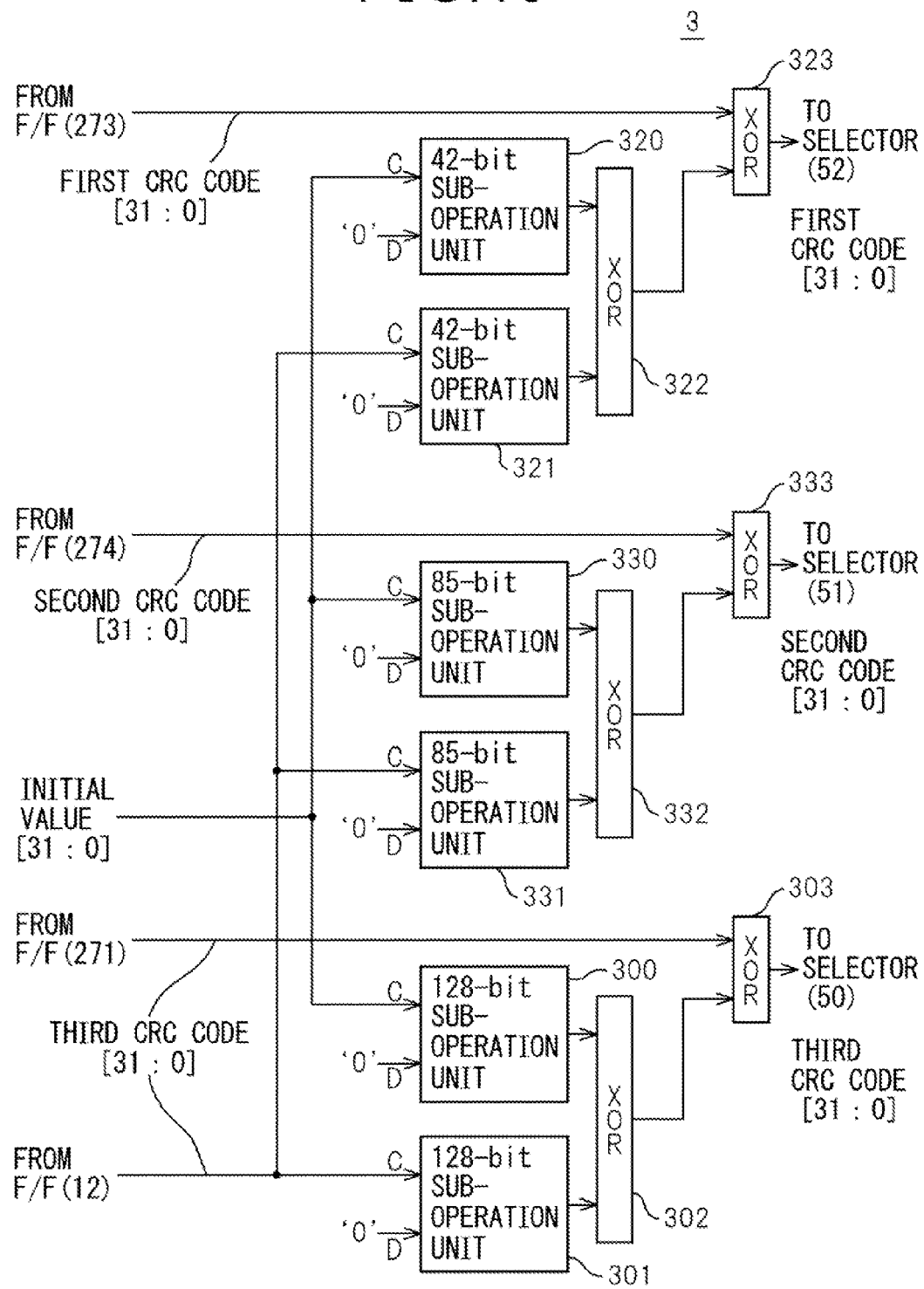
FIG. 16 is a diagram illustrating a configuration example of a correction unit depicted in FIG. 12.

FIG. 16 is a diagram illustrating a configuration example of the correction unit 3 depicted in FIG. 12. Components elements similar to those in FIG. 4 are designated by the same reference numerals as those used in FIG. 4. The correction unit 3 includes 128-bit sub-operation units 300 and 301 and XOR circuits 302 and 303. The correction unit 3 further includes 42-bit sub-operation units 320 and 321 and XOR circuits 322 and 323. Further, the correction unit 3 includes 85-bit sub-operation units 330 and 331 and XOR circuits 332 and 333.

The CRC code output from the 42-bit sub-operation unit 202 in the CRC calculation unit 2 and held in the flip-flop 273 is supplied to the correction unit 3 as the first CRC code to be corrected. The CRC code output from the 43-bit sub-operation unit 203 and held in the flip-flop 274 is supplied to the correction unit 3 as the second CRC code to be corrected. The CRC code output from the 43-bit sub-operation unit 204 in the final pipeline stage of the CRC calculation unit 2 and held in the flip-flop 271 is supplied to the correction unit 3 as the third CRC code to be corrected.

The 128-bit sub-operation units 300 and 301 and XOR circuits 302 and 303 correct the third CRC code and produce the corrected third CRC code. The output of the XOR circuit 303 is placed on the input line "0" to the selector 50.

The 42-bit sub-operation units 320 and 321 are each identical in function to the 128-bit sub-operation unit 300, except that the number of bits in the parallel data for which the CRC code is calculated is 42. Likewise, the 85-bit sub-operation units 330 and 331 are each identical in function to the 128-bit sub-operation unit 300, except that the number of bits in the parallel data for which the CRC code is calculated is 85.

The initial value is input on the input line "C" to the 42-bit sub-operation unit 320, while the third CRC code output from the flip-flop 12 is input on the input line "C" to the 42-bit sub-operation unit 321. The third CRC code output from the flip-flop 12 is one that is calculated one clock cycle earlier than the first CRC code to be corrected.

The initial value is input on the input line "C" to the 85-bit sub-operation unit 330, while the third CRC code output from the flip-flop 12 is input on the input line "C" to the 85-bit sub-operation unit 331.

The XOR circuit 322 outputs the exclusive-OR of the outputs of the 42-bit sub-operation units 320 and 321 to calculate the correction value to be applied to the first CRC code for correction. The XOR circuit 323 outputs the exclusive-OR of the correction value with the first CRC code to be corrected. That is, the XOR circuit 323 outputs the corrected first CRC code by correcting the first CRC code with the correction value. The output of the XOR circuit 323 is placed on the input line "0" to the selector 52.

The XOR circuit 332 outputs the exclusive-OR of the outputs of the 85-bit sub-operation units 330 and 331 to calculate the correction value to be applied to the second CRC code for correction. The XOR circuit 333 outputs the exclusive-OR of the correction value with the second CRC code to be corrected. That is, the XOR circuit 333 outputs the corrected second CRC code by correcting the second CRC code with the correction value. The output of the XOR circuit 333 is placed on the input line "0" to the selector 51.

According to the present embodiment, the CRC code can be generated even for the data having such a data format that allows the header and the CRC code to be inserted in any one of the first to third sub-data.

Figure 17:
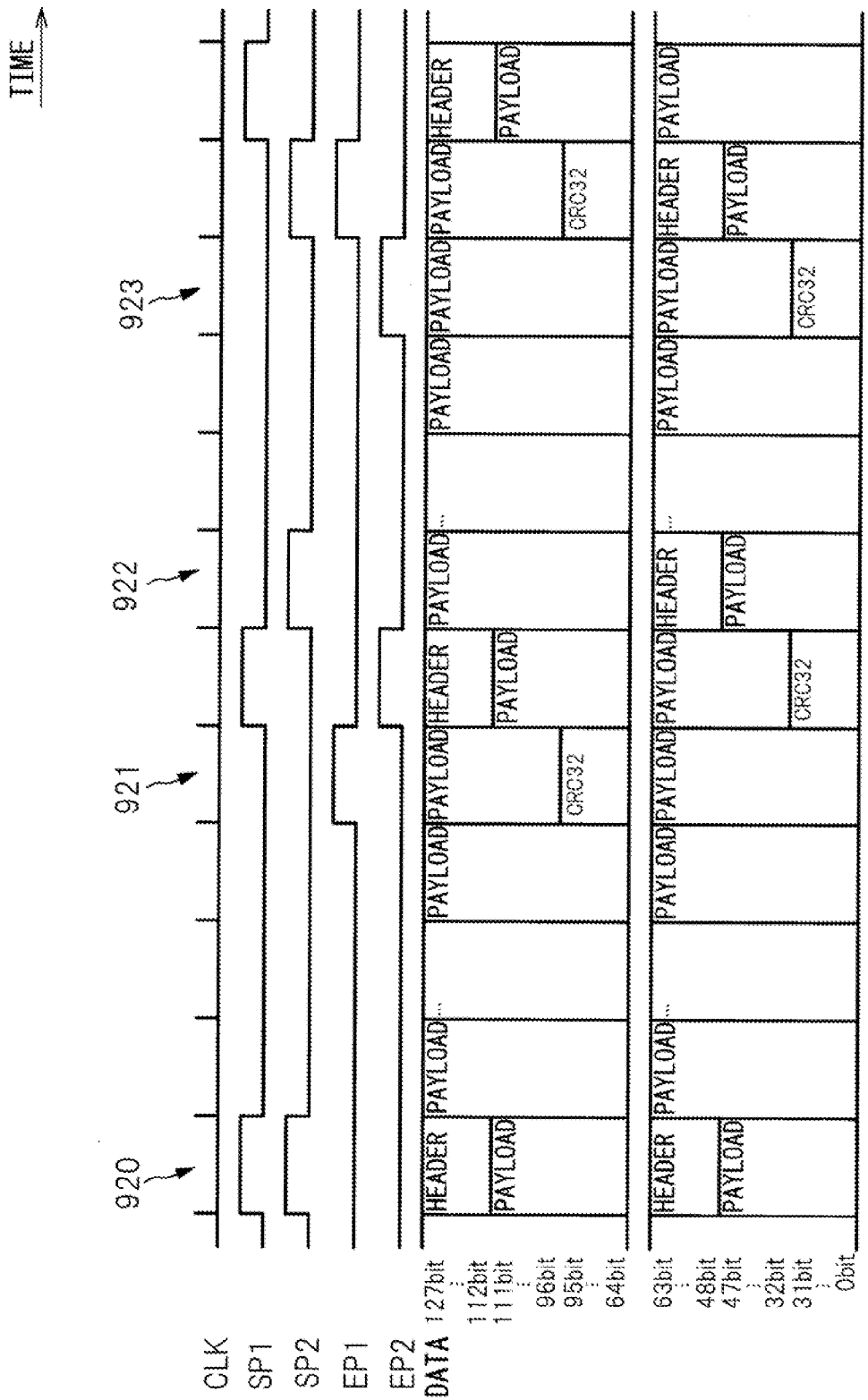
FIG. 17 is a timing chart illustrating a third example of the data format.

Next, another embodiment of the CRC code generating circuit will be described. FIG. 17 is a timing chart illustrating a third example of the data format. In FIG. 17, the first row indicates the timing for generating clock timing edge, the second row indicates a first start pulse SP1, and the third row indicates a second start pulse SP2. The fourth row of FIG. 17 indicates a first end pulse EP1, and the fifth row indicates a second end pulse EP2.

The sixth row of FIG. 17 indicates the parallel data. "HEADER" in the data denotes the header information appended at the beginning of the parallel data, and "CRC32" in the data denotes the CRC code. In the illustrated format example, the high-order data and the low-order data are independent of each other, and the header is inserted at the beginning of each data sequence and the CRC code at the end thereof.

The first start pulse SP1 is asserted in the clock cycle in which the beginning of the high-order data occurs. The second start pulse SP2 is asserted in the clock cycle in which the beginning of the low-order data occurs. The first end pulse EP1 is asserted in the clock cycle in which the CRC code is inserted in the high-order data. The second end pulse EP2 is asserted in the clock cycle in which the CRC code is inserted in the low-order data.

For example, if, in clock cycle 920, the beginning of the high-order data occurs, the first start pulse SP1 is asserted in clock cycle 920. The header is inserted in the high-order data in clock cycle 920. In clock cycle 921, the first end pulse EP1 is asserted, which indicates that the CRC code is inserted in the high-order data in clock cycle 921.

Further, for example, if, in clock cycle 922, the beginning of the low-order data occurs, the second start pulse SP2 is asserted in clock cycle 922. The header is inserted in the low-order data in clock cycle 922. In clock cycle 923, the second end pulse EP2 is asserted, which indicates that the CRC code is inserted in the low-order data in clock cycle 923.

Figure 18:
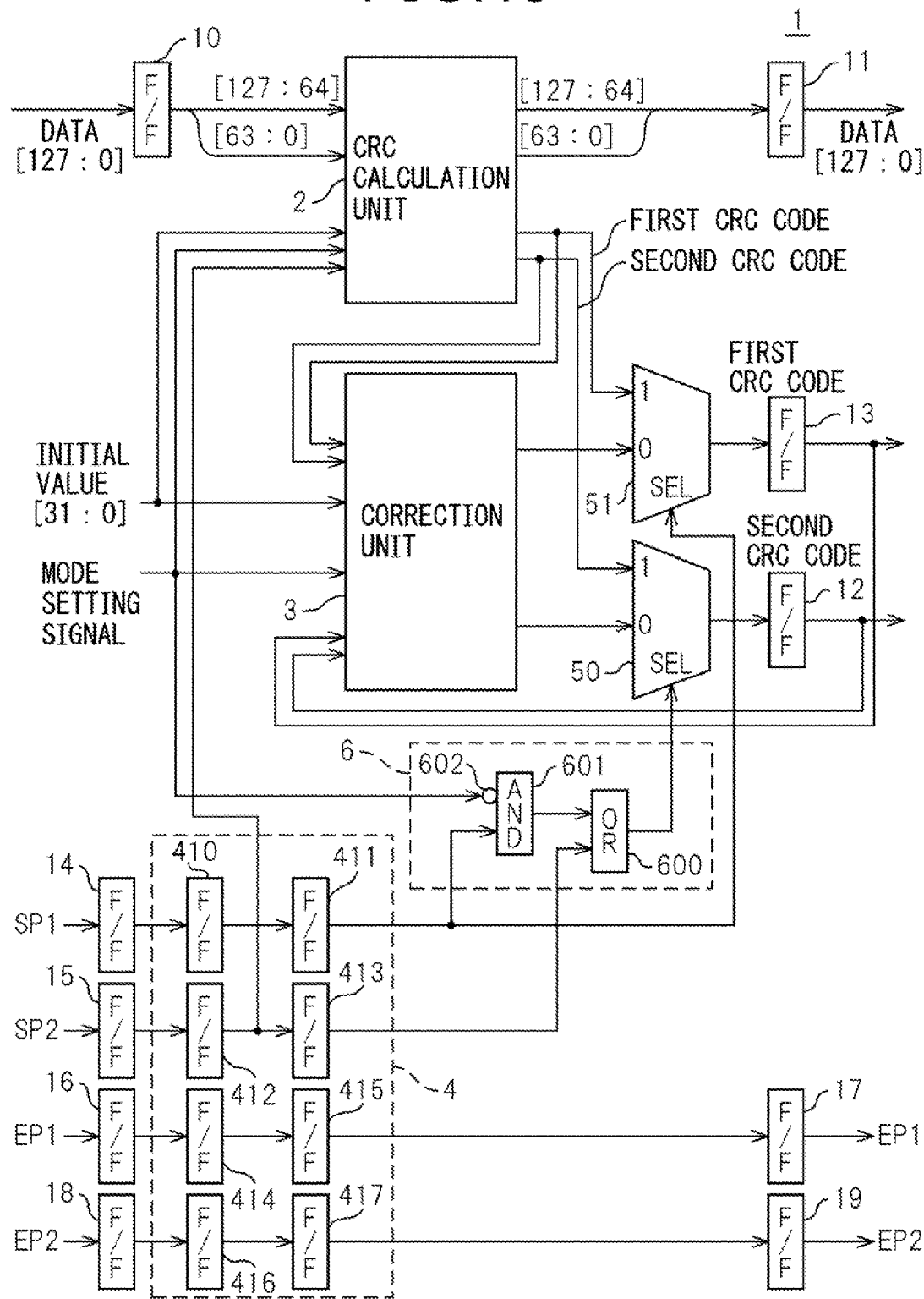
FIG. 18 is a diagram illustrating the configuration of a fifth embodiment of the CRC code generating circuit.

FIG. 18 is a diagram illustrating the configuration of an embodiment of the CRC code generating circuit that calculates the CRC code for the data of the format depicted in FIG. 17. Unless otherwise defined, components elements similar to those in FIG. 9 are designated by the same reference numerals as those used in FIG. 9. The CRC code generating circuit 1 here includes a CRC calculation unit 2, a correction unit 3, a shift register 4, selectors 50 and 51, a select signal generating unit 6, and flip-flops 10 to 19. The shift register 4 includes flip-flops 410 to 417.

The CRC code generating circuit 1 receives a mode setting signal. When the mode setting signal is not asserted, the CRC code generating circuit 1 operates in the same manner as the CRC code generating circuit 1 depicted in FIG. 9. When the mode setting signal is asserted, the CRC code generating circuit 1 operates so as to generate the CRC codes to be inserted in the high-order data and low-order data, respectively, of the data of the format depicted in FIG. 17. In the following description, the operation mode when the mode setting signal is not asserted may be designated as the "first mode." On the other hand, the operation mode when the mode setting signal is asserted may be designated as the "second mode."

In the first mode, there is no need to correct the second CRC code to be inserted in the low-order data in the clock cycle in which either the high-order data or the low-order data contains the beginning of the parallel data. In contrast, in the second mode, only the second CRC code to be inserted in the low-order data that contains the beginning of the parallel data need not be corrected. For this purpose, the select signal generating circuit 6 includes an AND circuit 601 and an inverter 602 which in combination block the input of the first start pulse SP1 to the OR circuit 600 when the mode setting signal is asserted.

Figure 19:
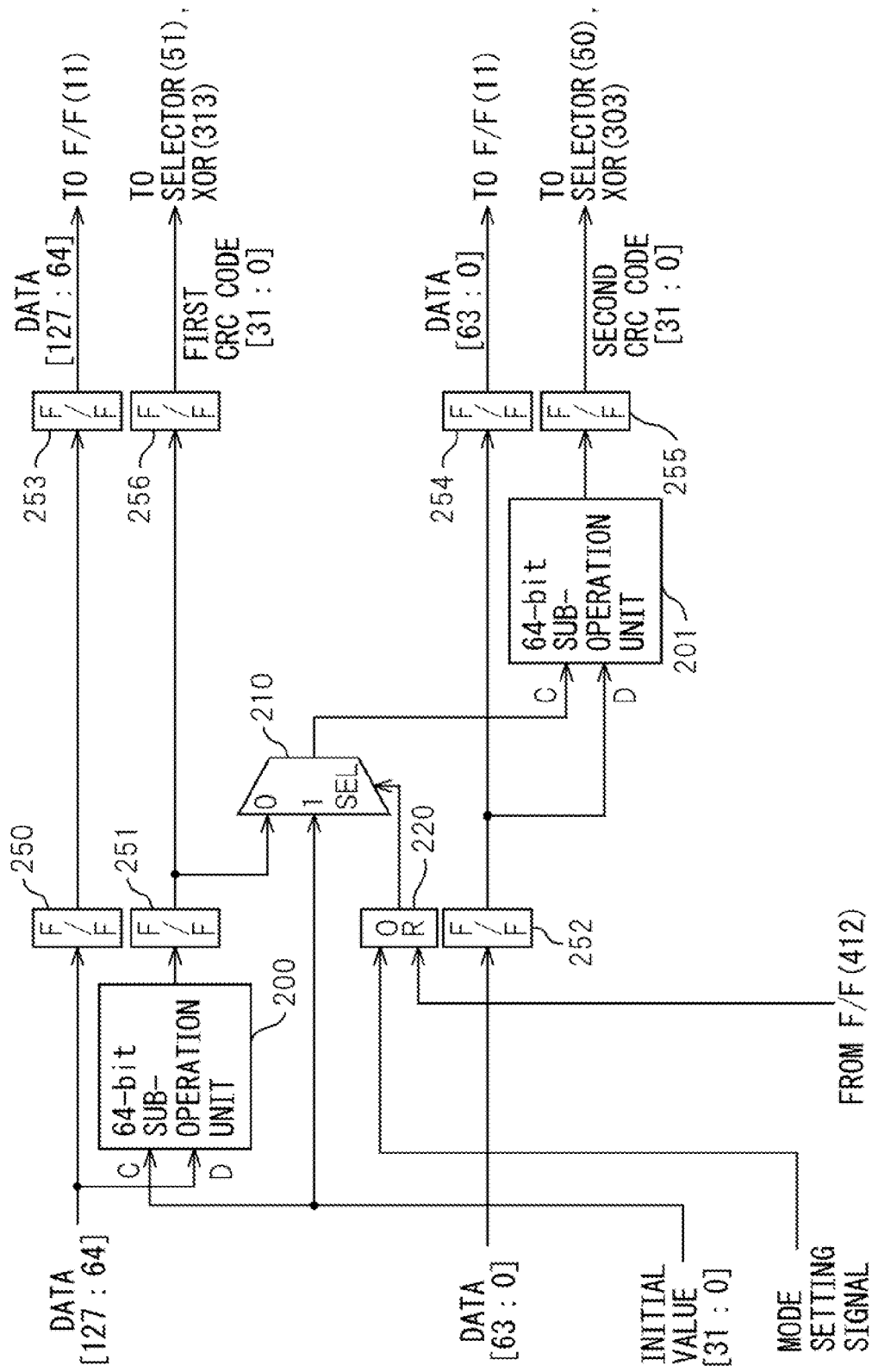
FIG. 19 is a diagram illustrating a configuration example of a CRC calculation unit depicted in FIG. 18.

FIG. 19 is a diagram illustrating a configuration example of the CRC calculation unit 2 depicted in FIG. 18. Components elements similar to those in FIG. 10 are designated by the same reference numerals as those used in FIG. 10. The CRC calculation unit 2 includes 64-bit sub-operation units 200 and 201, flip-flops 250 to 256, a selector 210, and an OR circuit 220.

In the second mode, the 64-bit sub-operation unit 201 calculates the CRC code for the low-order data, independently of the CRC code calculated for the high-order data by the 64-bit sub-operation unit 200. For this purpose, the OR circuit 220 calculates the OR of the mode setting signal with the second start pulse SP2 delayed through the flip-flop 412, and outputs the calculated logical add (OR) as the select signal to the selector 210. As a result, in the second mode, the initial value is input to the 64-bit sub-operation unit 201, irrespective of the value of the second start pulse SP2.

Figure 20:
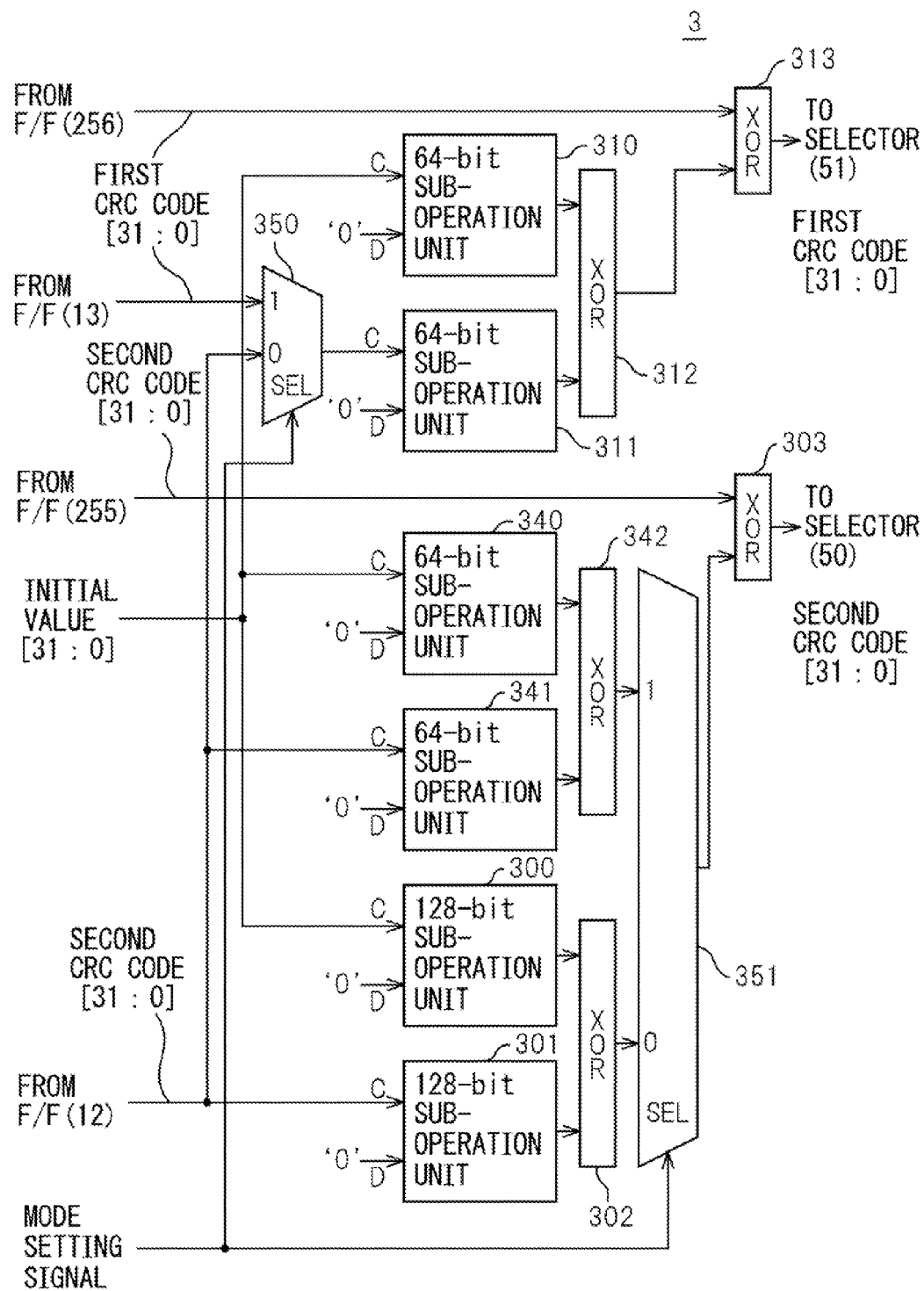
FIG. 20 is a diagram illustrating a configuration example of a correction unit depicted in FIG. 18.

FIG. 20 is a diagram illustrating a configuration example of the correction unit 3 depicted in FIG. 18. Components elements similar to those in FIG. 11 are designated by the same reference numerals as those used in FIG. 11. The correction unit 3 includes 128-bit sub-operation units 300 and 301 and XOR circuits 302 and 303. The correction unit 3 further includes 64-bit sub-operation units 310 and 311 and XOR circuits 312 and 313.

Further, the correction unit 3 includes 64-bit sub-operation units 340 and 341 and an XOR circuit 342. The 64-bit sub-operation units 340 and 341 are each identical in function to the 64-bit sub-operation unit 310. The correction unit 3 further includes selectors 350 and 351.

In the first mode, the 64-bit sub-operation units 310 and 311 and the XOR circuit 312 calculate the correction value for the first CRC code, based on the initial value and the second CRC code calculated one clock cycle earlier. In the second mode, on the other hand, the 64-bit sub-operation units 310 and 311 and the XOR circuit 312 calculate the correction value for the first CRC code, based on the initial value and the first CRC code calculated one clock cycle earlier.

Based on the mode setting signal, the selector 350 selects either the first CRC code or the second CRC code output from the flip-flop 13 or 12, respectively, as the signal to be output on the input line "C" to the 64-bit sub-operation unit 311. The selector 350 is given as one example of the third selector described in the appended claims.

The 64-bit sub-operation units 340 and 341 and the XOR circuit 342 calculate the correction value for the CRC code to be inserted in the low-order data in the second mode. The initial value is supplied via the input line "C" to the 64-bit sub-operation unit 340, and the second CRC code output from the flip-flop 12 is supplied via the input line "C" to the 64-bit sub-operation unit 341. The XOR circuit 342 outputs the exclusive-OR of the outputs of the 64-bit sub-operation units 340 and 341 to calculate the correction value for the second CRC code in the second mode. Based on the mode setting signal, the selector 351 selects as the correction value for the second CRC code the correction value output from the XOR circuit 302 or 342.

According to the present embodiment, the CRC code can be generated even for the data having a data format in which the high-order data and the low-order data are independent of each other.

Figure 21:
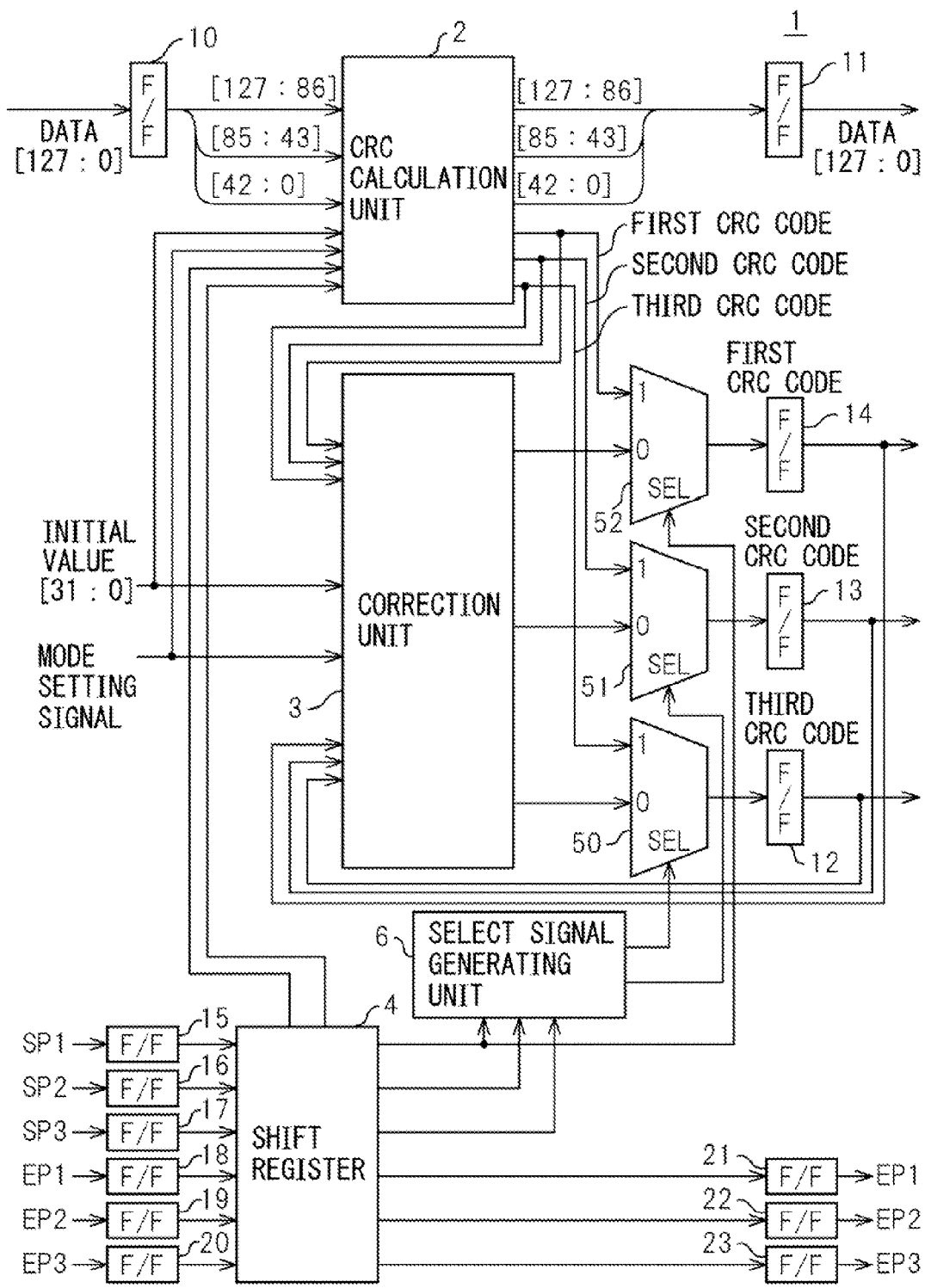
FIG. 21 is a diagram illustrating the configuration of a sixth embodiment of the CRC code generating circuit.

Next, another embodiment of the CRC code generating circuit will be described. FIG. 21 is a diagram illustrating the configuration of a sixth embodiment of the CRC code generating circuit. In the case of the CRC code generating circuit 1 of FIG. 18, the CRC code has been generated for the data having a data format in which the 128-bit parallel data is divided into two equal parts, the high-order data and the low-order data, that are independent of each other. However, the parallel data may be divided into three or more sub-data that are independent of one another. Further, the number of bits in any one of the sub-data may be made different from that in any of the other sub-data.

Figure 22:
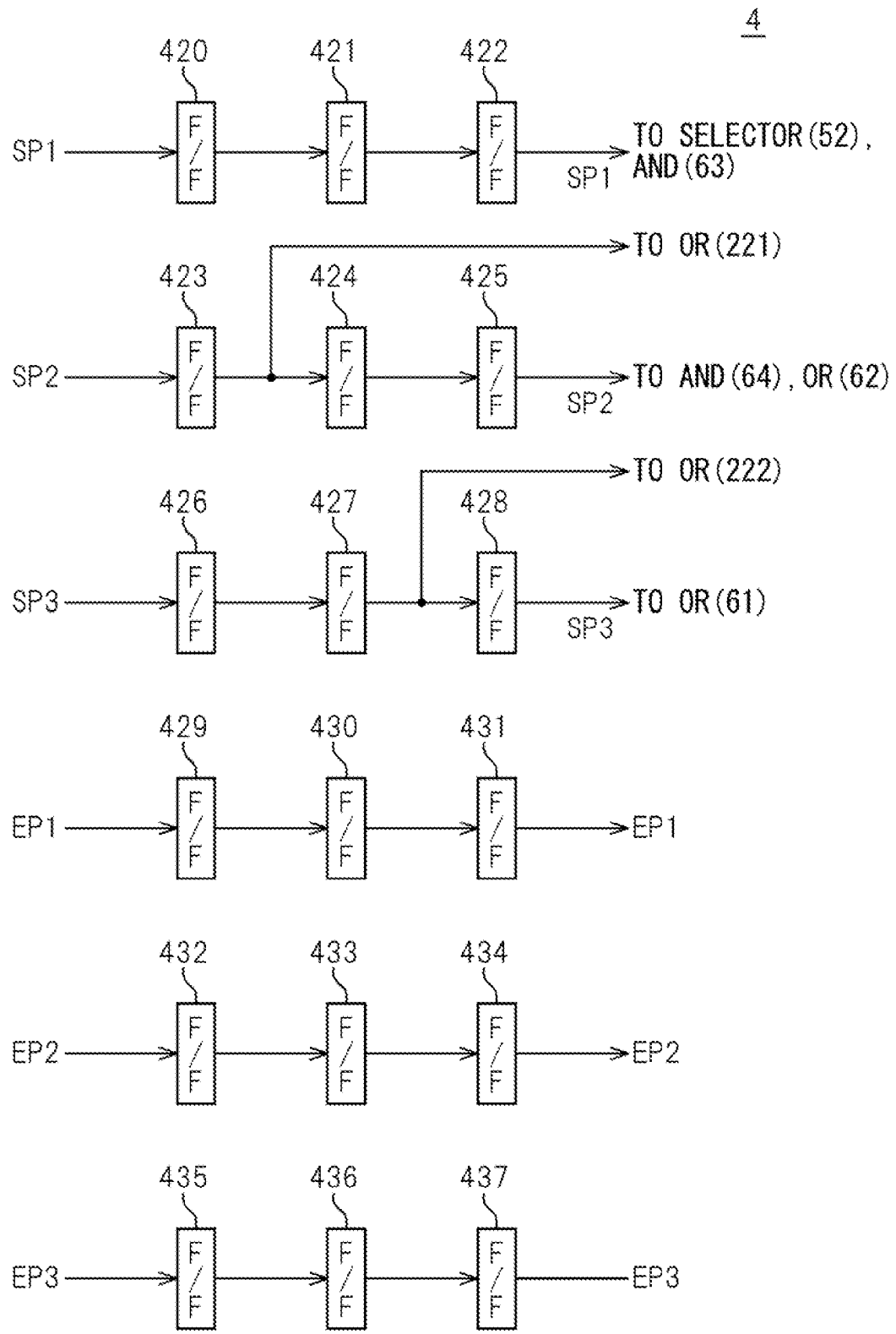
FIG. 22 is a diagram illustrating a configuration example of a shift register depicted in FIG. 21.

Unless otherwise defined, components elements similar to those in FIG. 12 are designated by the same reference numerals as those used in FIG. 12. The CRC code generating circuit 1 includes a CRC calculation unit 2, a correction unit 3, a shift register 4, selectors 50 to 52, a select signal generating unit 6, and flip-flops 10 to 23. FIG. 22 is a diagram illustrating a configuration example of the shift register 4 depicted in FIG. 21. Components elements similar to those in FIG. 13 are designated by the same reference numerals as those used in FIG. 13. The shift register 4 includes flip-flops 420 to 437.

The CRC code generating circuit 1, like the CRC code generating circuit 1 depicted in FIG. 18, receives a mode setting signal. When the mode setting signal is not asserted, the CRC code generating circuit 1 operates in the same manner as the CRC code generating circuit 1 depicted in FIG. 12. When the mode setting signal is asserted, the CRC code generating circuit 1 operates so as to generate the CRC codes to be inserted in the respective sub-data of the data of the data format in which the first to third sub-data are independent of one another.

Figure 23:
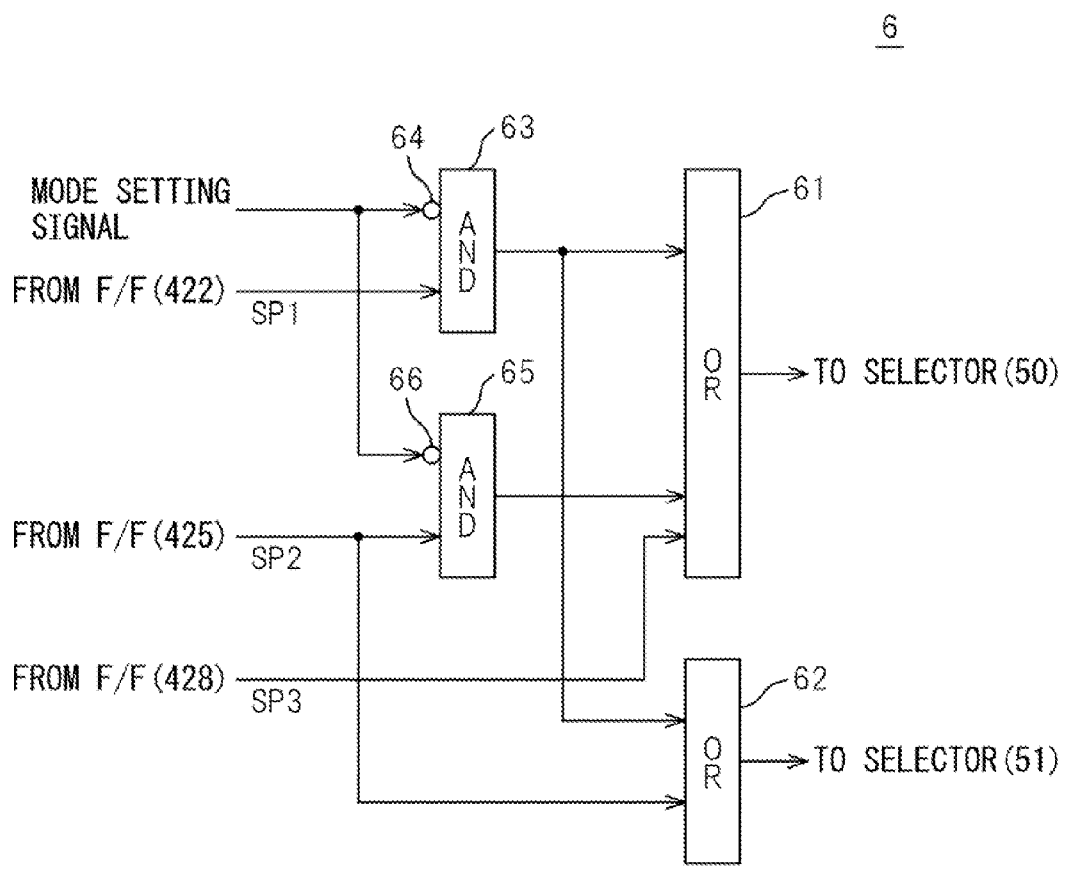
FIG. 23 is a diagram illustrating a configuration example of a select signal generating unit depicted in FIG. 21.

FIG. 23 is a diagram illustrating a configuration example of the select signal generating unit 6 depicted in FIG. 21. Components elements similar to those in FIG. 15 are designated by the same reference numerals as those used in FIG. 15. In the second mode, only the second CRC code to be inserted in the second sub-data that contains the beginning of the parallel data need not be corrected. Further, in the second mode, only the third CRC code to be inserted in the third sub-data that contains the beginning of the parallel data need not be corrected.

For this purpose, the select signal generating circuit 6 includes an AND circuit 63 and an inverter 64 which in combination block the input of the first start pulse SP1 to the OR circuits 61 and 62 when the mode setting signal is asserted. Further, the select signal generating circuit 6 includes an AND circuit 65 and an inverter 66 which in combination block the input of the second start pulse SP2 to the OR circuit 61 when the mode setting signal is asserted.

Figure 24:
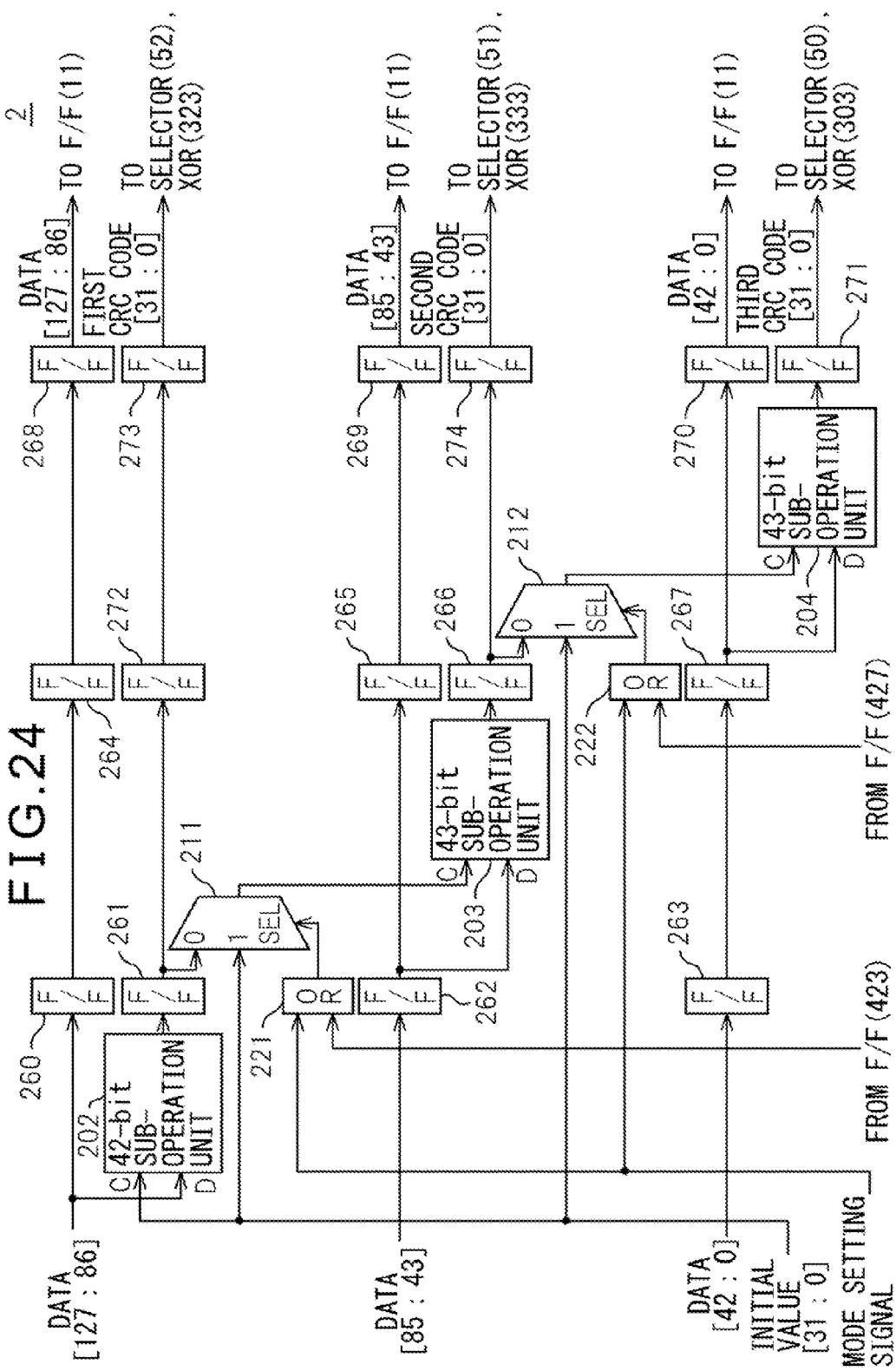
FIG. 24 is a diagram illustrating a configuration example of a CRC calculation unit depicted in FIG. 21.

FIG. 24 is a diagram illustrating a configuration example of the CRC calculation unit 2 depicted in FIG. 21. Components elements similar to those in FIG. 14 are designated by the same reference numerals as those used in FIG. 14. The CRC calculation unit 2 includes a 42-bit sub-operation unit 202, 43-bit sub-operation units 203 and 204, flip-flops 260 to 274, selectors 211 and 212, and OR circuits 221 and 222.

In the second mode, the 43-bit sub-operation unit 203 calculates the CRC code for the second sub-data, independently of the CRC code calculated for the first sub-data by the 42-bit sub-operation unit 202. For this purpose, the OR circuit 221 calculates the OR of the mode setting signal with the second start pulse SP2 delayed through the flip-flop 423, and outputs the calculated logical add (OR) as the select signal to the selector 211. As a result, in the second mode, the initial value is input to the 43-bit sub-operation unit 203, irrespective of the value of the second start pulse SP2.

Further, in the second mode, the 43-bit sub-operation unit 204 calculates the CRC code for the third sub-data, independently of the CRC code calculated for the second sub-data by the 43-bit sub-operation unit 203. For this purpose, the OR circuit 222 calculates the OR of the mode setting signal with the third start pulse SP3 delayed through the flip-flop 427, and outputs the calculated logical add (OR) as the select signal to the selector 212. As a result, in the second mode, the initial value is input to the 43-bit sub-operation unit 204, irrespective of the value of the third start pulse SP3.

Figure 25:
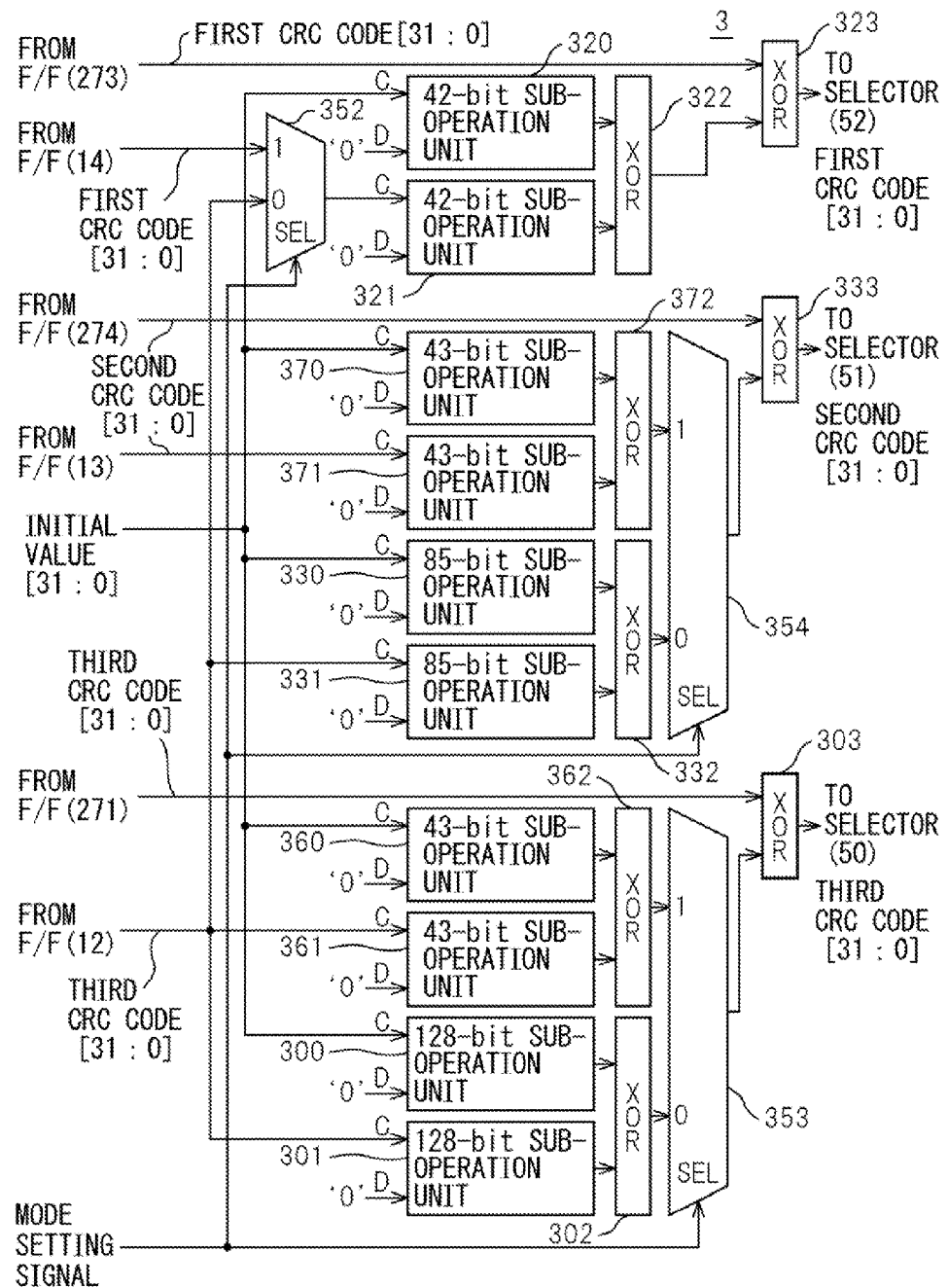
FIG. 25 is a diagram illustrating a configuration example of a correction unit depicted in FIG. 21.

FIG. 25 is a diagram illustrating a configuration example of the correction unit 3 depicted in FIG. 21. Components elements similar to those in FIG. 16 are designated by the same reference numerals as those used in FIG. 16. The correction unit 3 includes 128-bit sub-operation units 300 and 301 and XOR circuits 302 and 303. The correction unit 3 further includes 42-bit sub-operation units 320 and 321 and XOR circuits 322 and 323. The correction unit 3 further includes 85-bit sub-operation units 330 and 331 and XOR circuits 332 and 333.

Further, the correction unit 3 includes 43-bit sub-operation units 360 and 361 and an XOR circuit 362. Furthermore, the correction unit 3 includes 43-bit sub-operation units 370 and 371 and an XOR circuit 372. The correction unit 3 further includes selectors 352 to 354. The 43-bit sub-operation units 360, 361, 370, and 371 are each identical in function to the 128-bit sub-operation unit 300, except that the number of bits in the parallel data for which the CRC code is calculated is 43.

In the first mode, the 42-bit sub-operation units 320 and 321 and the XOR circuit 322 calculate the correction value for the first CRC code, based on the initial value and the third CRC code calculated one clock cycle earlier. In the second mode, on the other hand, the 42-bit sub-operation units 320 and 321 and the XOR circuit 322 calculate the correction value for the first CRC code, based on the initial value and the first CRC code calculated one clock cycle earlier.

Based on the mode setting signal, the selector 352 selects either the first CRC code or the third CRC code output from the flip-flop 14 or 12, respectively, as the signal to be output on the input line "C" to the 42-bit sub-operation unit 321.

The 43-bit sub-operation units 370 and 371 and the XOR circuit 372 calculate the correction value for the CRC code to be inserted in the second sub-data in the second mode. The initial value is supplied via the input line "C" to the 43-bit sub-operation unit 370, and the second CRC code output from the flip-flop 13 is supplied via the input line "C" to the 43-bit sub-operation unit 371. The XOR circuit 372 outputs the exclusive-OR of the outputs of the 43-bit sub-operation units 370 and 371 to calculate the correction value for the second CRC code in the second mode. Based on the mode setting signal, the selector 354 selects as the correction value for the second CRC code the correction value output from the XOR circuit 332 or 372.

The 43-bit sub-operation units 360 and 361 and the XOR circuit 362 calculate the correction value for the CRC code to be inserted in the third sub-data in the second mode. The initial value is supplied via the input line "C" to the 43-bit sub-operation unit 360, and the third CRC code output from the flip-flop 12 is supplied via the input line "C" to the 43-bit sub-operation unit 361. The XOR circuit 362 outputs the exclusive-OR of the outputs of the 43-bit sub-operation units 360 and 361 to calculate the correction value for the third CRC code in the second mode. Based on the mode setting signal, the selector 353 selects as the correction value for the third CRC code the correction value output from the XOR circuit 302 or 362.

According to the present embodiment, the CRC code can be generated even for the data having a data format that contains the first to third sub-data independent of one another.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A cyclic redundancy check code generating circuit which successively receives one or more parallel data as input, and which generates a cyclic redundancy check code for the one or more parallel data by repetitively performing a operation for calculating a cyclic redundancy check code for each of the parallel data, based on the parallel data and on an initial value or an earlier calculated cyclic redundancy check code, comprising:

a plurality of sub-operation units which, based on the initial value and the parallel data, perform sub-operations created by decomposing the operation in a bit length direction of the parallel data, in different pipeline stages, respectively; and a correction unit which, based on the initial value and the earlier calculated cyclic redundancy check code, corrects the cyclic redundancy check code calculated by the sub-operation units.

2. The cyclic redundancy check code generating circuit as claimed in claim 1, further comprising a first selector which selects either the cyclic redundancy check code corrected by the correction unit or the cyclic redundancy check code not corrected, depending on whether the input parallel data contains starting data of the one or more parallel data.

3. The cyclic redundancy check code generating circuit as claimed in claim 1, further comprising a second selector which selects either the initial value or the cyclic redundancy check code output from a designated one of the sub-operation units and which supplies the selected value or code to one of the sub-operation units that is located in a pipeline stage immediately following the designated sub-operation unit, and wherein the correction unit includes at least a first correction unit which corrects the cyclic redundancy check code output from the designated sub-operation unit, and a second correction unit which corrects the cyclic redundancy check code output from one of the sub-operation units that is located in a final pipeline stage.

4. The cyclic redundancy check code generating circuit as claimed in claim 3, further comprising a third selector which selects as the earlier calculated cyclic redundancy check code either the cyclic redundancy check code corrected by the first correction unit or the cyclic redundancy check code corrected by the second correction unit, and which supplies the selected cyclic redundancy check code to the first correction unit.

5. The cyclic redundancy check code generating circuit as claimed in claim 1, further comprising a fourth selector which selects either the initial value or the cyclic redundancy check code output from a designated one of the sub-operation units and which supplies the selected value or code to one of the sub-operation units that is located in a pipeline stage immediately following the designated sub-operation unit, and wherein the correction unit includes:

a third correction unit which corrects the cyclic redundancy check code that the sub-operation unit located in the immediately following pipeline stage calculated based on the initial value and on the cyclic redundancy check code output from the designated sub-operation unit;

a fourth correction unit which corrects the cyclic redundancy check code that the sub-operation unit located in the immediately following pipeline stage calculated based on the initial value and the parallel data; and a fifth selector which selects either the cyclic redundancy check code corrected by the third correction unit or the cyclic redundancy check code corrected by the fourth correction unit.

6. The cyclic redundancy check code generating circuit as claimed in claim 1, wherein the number of bits of the parallel data to be input to one of the sub-operation units is different from the number of bits of the parallel data to be input to any one of the other sub-operation units.

7. A cyclic redundancy check code generating method which successively receives one or more parallel data, and which generates a cyclic redundancy check code for the one or more parallel data by repetitively performing a operation for calculating a cyclic redundancy check code for each of the parallel data, based on the parallel data and on an initial value or an earlier calculated cyclic redundancy check code, the method comprising:

based on the initial value and the parallel data, performing sub-operations created by decomposing the operation in a bit length direction of the parallel data, in different pipeline stages, respectively; and based on the initial value and the earlier calculated cyclic redundancy check code, correcting the cyclic redundancy check code calculated by the sub-operations.

\* \* \* \* \*